(12) United States Patent
Hosomi et al.

(10) Patent No.: US 8,044,505 B2
(45) Date of Patent: Oct. 25, 2011

(54) PREPREG, METHOD FOR MANUFACTURING PREPREG, SUBSTRATE, AND SEMICONDUCTOR DEVICE

(75) Inventors: Takeshi Hosomi, Tokyo (JP); Maroshi Yuasa, Tokyo (JP); Kazuya Hamaya, Tokyo (JP); Takayuki Baba, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 145 days.

(21) Appl. No.: 12/085,782

(22) PCT Filed: Nov. 30, 2006

(86) PCT No.: PCT/JP2006/323994
§ 371 (c)(1),
(2), (4) Date: Jul. 16, 2009

(87) PCT Pub. No.: WO2007/063960
PCT Pub. Date: Jun. 7, 2007

(65) Prior Publication Data
US 2009/0302462 A1 Dec. 10, 2009

(30) Foreign Application Priority Data

Dec. 1, 2005 (JP) .................................. 2005-348546
Aug. 9, 2006 (JP) .................................. 2006-216432

(51) Int. Cl.
*H01L 23/053* (2006.01)
*H01L 23/12* (2006.01)
*H01L 23/14* (2006.01)
*H01L 23/58* (2006.01)
(52) U.S. Cl. ......... 257/701; 257/702; 257/635; 257/642
(58) Field of Classification Search .................. 257/734; 438/734, 701, 702, 703, 635, 636, 638, 642, 438/640, 639, 643, 645, 649, 651, 787, 790, 438/791, 792
See application file for complete search history.

(56) References Cited

U.S. PATENT DOCUMENTS

| 6,866,919 B2 | 3/2005 | Ikeguchi et al. |
| 2003/0162006 A1 | 8/2003 | Ikeguchi et al. |

FOREIGN PATENT DOCUMENTS

| JP | 2003-340952 | * 12/2003 |
| TW | 228454 | 3/2005 |
| WO | 2005/092945 | 10/2005 |

* cited by examiner

OTHER PUBLICATIONS

Chinese Office Action for Application No. 200680045072.1 issued on Sep. 3, 2010.

*Primary Examiner* — Chuong A. Luu
(74) *Attorney, Agent, or Firm* — Smith, Gambrell & Russell, LLP

(57) ABSTRACT

A prepreg which can meet a demand for thickness reduction is provided. The prepreg has first and second resin layers having different applications, functions, capabilities, or properties, and allows an amount of a resin composition in each of the first and second resin layers to be set appropriately depending on a circuit wiring portion to be embedded into the second resin layer. Further, a method for manufacturing the above prepreg, and a substrate and a semiconductor device having the prepreg are also provided. The prepreg according to the present invention includes a core layer including a sheet-shaped base member and having one surface and the other surface which is opposite to the one surface, the first resin layer provided on the one surface of the core layer and formed of a first resin composition, and the second resin layer provided on the other surface of the core layer and formed of a second resin composition, wherein at least one of a requirement that a thickness of the first resin layer is different from that of the second resin layer and a requirement that a constitution of the first resin composition is different from that of the second resin composition is satisfied.

27 Claims, 7 Drawing Sheets

PREPREG, METHOD FOR MANUFACTURING PREPREG, SUBSTRATE, AND SEMICONDUCTOR DEVICE

FIELD OF THE INVENTION

The present invention relates to a prepreg, a method for manufacturing the prepreg, a substrate formed using the prepreg, and a semiconductor device provided with the substrate.

BACKGROUND

A circuit substrate is formed using a prepreg obtained by impregnating a sheet-shaped base member, such as a glass fiber base material, with thermosetting resin. For example, Japanese Patent Application Laid-open No. 2004-216784 (hereinafter, simply referred to as "Patent Document 1") discloses a method for manufacturing a prepreg by immersing a glass fiber base material having a thickness of about 50 to 200 μm into a thermosetting resin varnish.

In a prepreg obtained by such a method, a resin composition is supported by the glass fiber base material, and two resin layers formed of the resin composition are symmetrically provided on both surfaces (sides) of the glass fiber base material. More specifically, such a prepreg has a structure in which two resin layers formed of the same resin composition and having the same thickness are provided on both the surfaces of the glass fiber base material.

Meanwhile, in recent years, electronic parts, electronic devices and the like are becoming increasingly smaller and thinner, and therefore circuit substrates and the like used for them are also required to be smaller and thinner. This leads to necessity for forming a higher-density circuit wiring portion (circuit wiring pattern) in the circuit substrates.

In order to form such a higher-density circuit wiring portion, a multilayer circuit substrate is used. In addition, various attempts have been made to reduce a thickness of each layer of the multilayer circuit substrate.

From a viewpoint of redaction of a thickness of a multilayer circuit substrate, generally, such a multilayer circuit substrate is manufactured by preparing a plurality of prepregs each having a circuit wiring portion on one surface thereof, and laminating the prepregs so that the circuit wiring portion provided on the one surface of the prepreg is embedded into an opposite surface of another prepreg laminated on the prepreg.

In this case, the one surface of the prepreg, on which the circuit wiring portion is to be formed, is required to have plating adhesiveness, and the other surface of the prepreg, into which a circuit wiring portion of the other prepreg is to be embedded, is required to have embeddability (moldability) for filling gaps between wires constituting the circuit wiring portion.

However, as described above, the prepreg disclosed in Patent Document 1 has two resin layers formed of the same resin composition on both the surfaces of the base material. Therefore, it is difficult to select a resin composition which allows each resin layer to have both properties of the plating adhesiveness and the embeddability. Such a problem becomes particularly conspicuous in the case where an attempt is made to reduce the thickness of the prepreg.

Further, there is also a case that a circuit wiring portion is embedded into each of two resin layers of a prepreg.

However, in the case where two circuit wiring portions having a different size such as thickness are embedded into the prepreg disclosed in Patent Document 1, there is a case that an amount of the resin composition constituting the resin layers becomes larger or smaller than a required amount of a resin composition to be filled in gaps between wires constituting each circuit wiring portion (hereinafter, also simply referred to as "gaps in a circuit wiring portion").

As a result, there is a problem in that the resin composition is squeezed out of an obtained substrate from a side surface thereof, the circuit wiring portion cannot be reliably embedded into the resin layer or the like.

As described above, it is difficult for the prepreg disclosed in Patent Document 1 to satisfy the following two requirements: (A) the prepreg has both properties of the plating adhesiveness and the embeddability; and (B) an amount of a resin composition can be set appropriately depending on a circuit wiring portion to be embedded thereinto.

Further, it is also difficult to manufacture a prepreg using a thin glass fiber base material by a conventional method.

SUMMARY OF THE INVENTION

It is therefore an object of the present invention to provide a prepreg which can meet a demand for thickness reduction and which can have two surfaces having different applications, functions, capabilities, or properties.

Another object of the present invention is to provide a prepreg which can meet a demand for thickness reduction and which allows an amount of a resin composition to be set appropriately depending on a circuit wiring portion to be embedded thereinto.

Yet another object of the present invention is to provide a method for manufacturing the prepreg according to the present invention, a substrate using the prepreg according to the present invention, and a semiconductor device provided with the substrate according to the present invention.

In order to achieve the object described above, the present invention is directed to a prepreg. The prepreg includes a core layer including a sheet-shaped base member, the core layer having one surface and the other surface which is opposite to the one surface, a first resin layer provided on the one surface of the core layer, the first resin layer formed of a first resin composition, and a second resin layer provided on the other surface of the core layer, the second resin layer formed of a second resin composition.

In such a prepreg, it is required that at least one of a requirement that a thickness of the first resin layer is different from that of the second resin layer and a requirement that a constitution of the first resin composition is different from that of the second resin composition is satisfied.

This makes it possible to provide a prepreg which can meet a demand for thickness reduction, and which can have two surfaces having different applications, functions, capabilities, or properties and/or which allows an amount of a resin composition to be set appropriately depending on a circuit wiring portion to be embedded thereinto.

Further, in the prepreg of the present invention, it is preferred that the constitution of the first resin composition is different from that of the second resin composition, and the prepreg is adapted to be used in a state that a conductor layer is provided on the first resin layer.

Furthermore, in the prepreg of the present invention, it is also preferred that when the conductor layer is bonded to the first resin layer, peel strength between the first resin layer and the conductor layer is 0.5 kN/m or more.

Moreover, in the prepreg of the present invention, it is also preferred that the thickness of the first resin layer is in the range of 3 to 15 μm.

Moreover, in the prepreg of the present invention, it is also preferred that the first resin composition contains thermosetting resin.

Moreover, in the prepreg of the present invention, it is also preferred that the thermosetting resin contains cyanate resin.

Moreover, in the prepreg of the present invention, it is also preferred that the cyanate resin contains novolak type cyanate resin.

Moreover, in the prepreg of the present invention, it is also preferred that the first resin composition further contains a curing agent.

Moreover, in the prepreg of the present invention, it is also preferred that the curing agent contains an imidazole based compound.

Moreover, in the prepreg of the present invention, it is also preferred that the first resin composition further contains second resin whose kind is different from that of the thermosetting resin.

Moreover, in the prepreg of the present invention, it is also preferred that the second resin contains phenoxy based resin.

Moreover, in the prepreg of the present invention, it is also preferred that the thickness of the first resin layer is thinner than that of the second resin layer.

Further, in the prepreg of the present invention, it is also preferred that the constitution of the first resin composition is identical with that of the second resin composition, and the thickness of the first resin layer is different from that of the second resin layer, and a thickness of the sheet-shaped base member is 25 μm or less.

Furthermore, in the prepreg of the present invention, it is also preferred that a thickness of the prepreg is 35 μm or less.

Moreover, in the prepreg of the present invention, it is also preferred that the resin composition contains thermosetting resin.

Moreover, in the prepreg of the present invention, it is also preferred that the thermosetting resin contains cyanate resin.

Moreover, in the prepreg of the present invention, it is also preferred that the resin composition further contains an inorganic filler.

The present invention is also directed to a method for manufacturing the above prepreg. The method includes preparing the core layer, a first sheet member having one surface on which the first resin composition is applied in the form of a layer, and a second sheet member having one surface on which the second resin composition is applied in the form of a layer, laminating the core layer with the first sheet member and the second sheet member so that the first resin composition and the second resin composition make contact with both surfaces of the core layer, respectively, whereby the core layer, the first sheet member and the second sheet member are joined together to obtain a laminate, and removing bubbles from the laminate. This makes it possible to manufacture the above prepreg easily and cheaply.

Further, in the method for manufacturing the prepreg of the present invention, it is also preferred that joining of the core layer, the first sheet member and the second sheet member is carried out under reduced pressure.

Furthermore, in the method for manufacturing the prepreg of the present invention, it is also preferred that removing of the bubbles from the laminate is carried out by a heat treatment.

Moreover, in the method for manufacturing the prepreg of the present invention, it is also preferred that the heat treatment is carried out at a temperature of a melting point or higher, wherein the melting point is a higher melting point than a melting point of the first resin composition and a melting point of the second resin composition.

Moreover, in the method for manufacturing the prepreg of the present invention, it is also preferred that the first sheet member is formed of a conductive material.

Moreover, in the method for manufacturing the prepreg of the present invention, it is also preferred that each of the first sheet member and the second member is formed from a resin sheet, and the method further includes after removing the bubbles from the laminate, removing the resin sheets from the laminate.

Moreover, in the method for manufacturing the prepreg of the present invention, it is also preferred that a surface of each of the resin sheets on which each resin composition is applied is subjected to a release treatment.

The present invention is also directed to a substrate. The substrate includes the above prepreg, and a circuit wiring portion embedded into the second resin layer of the prepreg. This makes it possible to obtain a substrate having a thin thickness.

Further, in the substrate of the present invention, it is also preferred that when a total thickness of the prepreg is defined by T0 μm and a height of the circuit wiring portion is defined by t1 μm, a difference of T0 and t1 is 35 μm or less.

Furthermore, in the substrate of the present invention, it is also preferred that thermal expansion coefficient of the prepreg at a plane direction thereof is 16 ppm or less.

The present invention is also directed to a substrate manufactured by laminating a plurality of the above prepregs. This makes it possible to obtain a substrate having a thin thickness.

The present invention is also directed to a semiconductor device. The semiconductor device includes the above substrate, and a semiconductor element mounted on the substrate. This makes it possible to obtain a semiconductor device having a thin thickness.

The present invention is also directed to a semiconductor device having the above substrate. This makes it possible to obtain a semiconductor device having a thin thickness.

BEST MODE FOR CARRYING OUT THE INVENTION

Hereinbelow, a prepreg, a method for manufacturing the prepreg, a substrate formed using the prepreg, and a semiconductor device provided with the substrate according to the present invention will be described.

The prepreg according to the present invention includes a core layer including a sheet-shaped base member and having one surface and the other surface which is opposite to the one surface, a first resin layer provided on the one surface of the core layer and formed of a first resin composition, and a second resin layer provided on the other surface of the core layer and formed of a second resin composition.

Further, the prepreg is adapted to be used in a state that a conductor layer is provided (formed) on the first resin layer. Furthermore, the prepreg satisfies at least one of a requirement that a thickness of the first resin layer is different from that of the second resin layer and a requirement that a constitution of the first resin composition is different from that of the second resin composition.

The method for manufacturing the prepreg according to the present invention includes preparing the core layer, a first sheet member having one surface on which the first resin composition is applied in the form of a layer, and a second sheet member having one surface on which the second resin composition is applied in the form of a layer, laminating the core layer with the first sheet member and the second sheet member so that the first resin composition and the second resin composition make contact with both surfaces of the core layer, respectively, whereby the core layer, the first sheet member and the second sheet member are joined together to obtain a laminate, and removing bubbles from the laminate.

Further, the substrate according to the present invention includes the prepreg according to the present invention and a circuit wiring portion embedded into the second resin layer of the prepreg.

Furthermore, the semiconductor device according to the present invention includes the substrate according to the present invention and a semiconductor element mounted on the substrate.

First Embodiment

First, a preferred embodiment (first embodiment) of the prepreg according to the present invention will be described based on the accompanying drawings.

Figure 1:
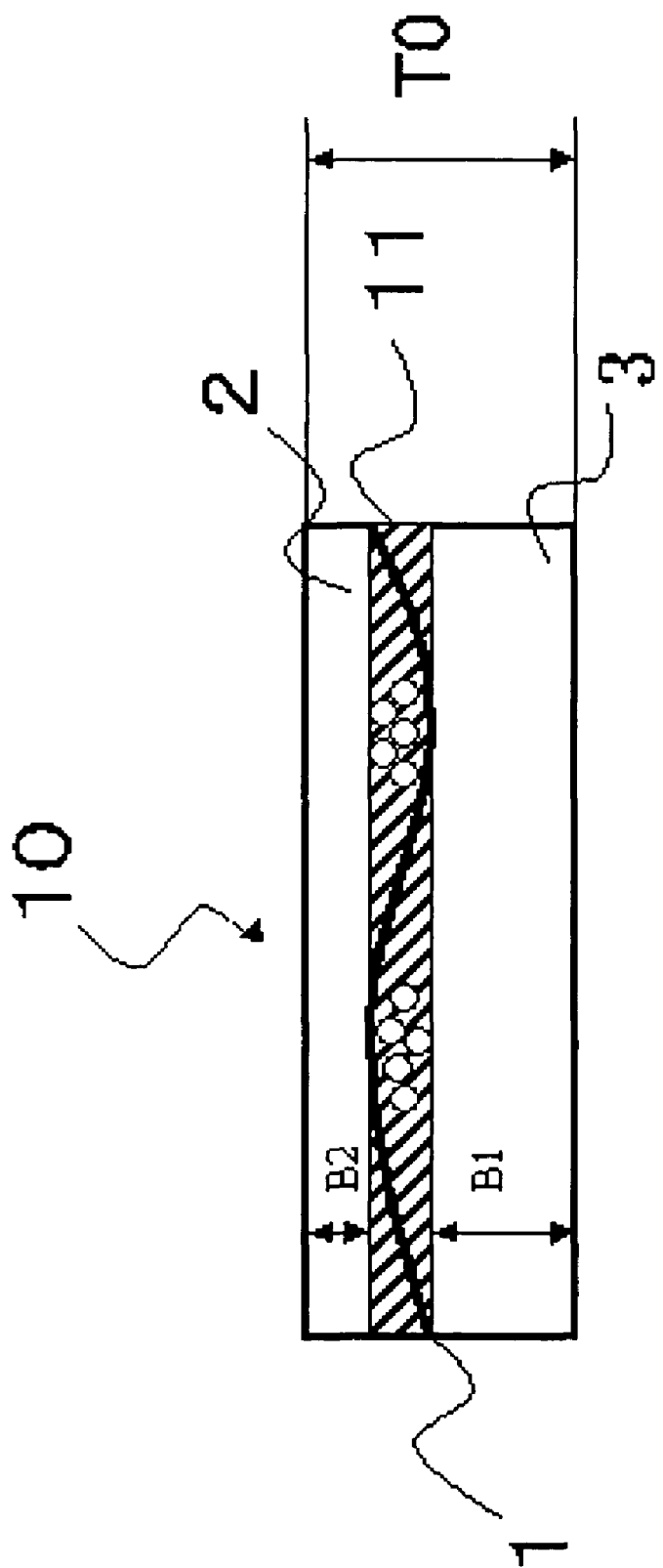
FIG. 1 is a sectional view showing one example (first embodiment) of the prepreg according to the present invention.

FIG. 1 is a sectional view showing one example (first embodiment) of the prepreg according to the present invention. In this regard, it is to be noted that, in the following description, the upper side and the lower side in FIG. 1 will be referred to as "upper side" and "lower side", respectively (the same goes for other drawings).

A prepreg (that is, a resin film for forming a multilayer wiring substrate) 10 includes a core layer 11 having a sheet-shaped base member (that is, a fiber base member) 1, a first resin layer 2 provided on one surface of the core layer 11, and a second resin layer 3 provided on the other surface of the core layer 11.

The first resin layer 2 of the prepreg 10 is formed of a first resin composition, and the second resin layer 3 of the prepreg 10 is formed of a second resin composition. In this embodiment, a constitution (composition) of the first resin composition is different from that of the second resin composition.

This makes it possible to design a formulation of a resin composition for each resin layer so that each resin layer can have desired properties, thereby reducing a total thickness of the prepreg 10 while allowing two resin layers thereof to have their respective desired properties.

The prepreg 10 shown in FIG. 1 is adapted to be used in a state that a conductor layer (not shown in the drawing) is provided on the first resin layer 2 (that is, an upper surface of the prepreg 10 in FIG. 1). Therefore, the first resin layer 2 is designed to have good adhesiveness to the conductor layer.

Further, since the second resin layer 3 is required to have properties different from those of the first resin layer 2, the second resin layer 3 is designed to satisfy such a requirement.

Hereinbelow, the core layer 11, the first resin layer 2, and the second resin layer 3 will be described in more detail in the named order.

(Core Layer)

The core layer 11 is mainly constituted from the sheet-shaped base member 1. The core layer 11 has a function of enhancing strength of the prepreg 10.

The core layer 11 may be constituted from the sheet-shaped base member 1 alone, or may be constituted from the sheet-shaped base member 1 in which a part of the first resin layer 2 and a part of the second resin layer 3 are impregnated on the both surfaces thereof, respectively.

Examples of such a sheet-shaped base member 1 include: a fiber base member such as a glass fiber base member (e.g., a glass woven cloth, a glass non-woven cloth), an organic fiber base member such as a synthetic fiber base member formed from a woven or non-woven cloth mainly made of polyamide-based resin fibers (e.g., polyamide resin fibers, aromatic polyamide resin fibers, wholly aromatic polyamide resin fibers), polyester-based resin fibers (e.g., polyester resin fibers, aromatic polyester resin fibers, wholly aromatic polyester resin fibers), polyimide resin fibers or fluorocarbon resin fibers, or a paper base member mainly formed from kraft paper, cotton linter paper or blended paper of linter and kraft pulp; a resin film such as a polyester film or a polyimide film; and the like.

Among these sheet-shaped base members, the glass fiber base member is preferably used. By using such a sheet-shaped base member, it is possible to enhance strength of the prepreg 10. In addition, it is also possible to reduce a thermal expansion coefficient of the prepreg 10.

Examples of a glass material for forming the glass fiber base member include E glass, C glass, A glass, S glass, D glass, NE glass, T glass, H glass, and the like. Among these glass materials, the S glass and the T glass are preferably used. By using such a glass material, it is possible to reduce a thermal expansion coefficient of the glass fiber base member, thereby reducing the thermal expansion coefficient of the prepreg 10.

A thickness of the sheet-shaped base member (fiber base member) 1 is not particularly limited to a specific value, but is preferably 30 μm or less, more preferably 25 μm or less, and most preferably in the range of 10 to 20 μm, thereby enabling a thickness of the prepreg 10 to be reduced.

By setting the thickness of the sheet-shaped base member 1 to a value within the above range, it is possible to reduce a thickness of an obtained substrate (which will be described later) while maintaining strength thereof. In addition, it is also possible to obtain a prepreg 10 having excellent workability for establishing interlayer connection and therefore to allow an obtained substrate to have excellent reliability of interlayer connection.

Here, it is to be noted that the phrase "workability for establishing interlayer connection" used herein means that upper and lower circuit wiring portions (that is, patterned conductor layers) can be easily connected to each other when a multilayered circuit substrate (hereinafter, also simply referred to as a "multilayer substrate") is manufactured.

Further, the phrase "reliability of interlayer connection (connection reliability)" used herein means that in an obtained multilayer substrate, upper and lower circuit wiring portions are reliably connected to each other and a short circuit does not occur between walls of through holes or via holes formed.

(First Resin Layer)

As shown in FIG. 1, the first resin layer 2 is provided on the one surface (upper surface in FIG. 1) of the core layer 11. As described above, the first resin layer 2 is formed of the first resin composition, and the first resin composition is designed to have good adhesiveness to a conductor layer to be provided on the first resin layer 2 (not shown in the drawing).

Such a first resin composition having good adhesiveness to the conductor layer contains curable resin, and further may contain at least one of a curing aid (e.g., a curing agent, a curing accelerator), an inorganic filler and the like, if necessary.

Examples of a method for improving adhesiveness between the first resin composition and the conductor layer include use of curable resin having good adhesiveness to the conductor layer, use of a curing aid (e.g., a curing agent, a curing accelerator) which can improve adhesiveness between the first resin composition and the conductor layer, use of an acid-soluble inorganic filler, use of an inorganic filler in combination with an organic filler, and the like.

As the curable resin having good adhesiveness to the conductor layer, thermosetting resin such as urea resin, melamine resin, bismaleimide resin, polyurethane resin, benzoxazine ring-containing resin, cyanate ester resin, bisphenol S type epoxy resin, bisphenol F type epoxy resin, or copolymeric epoxy resin of bisphenol S and bisphenol F is preferably used. Among these curable resins, cyanate resin (including a prepolymer of the cyanate resin) is more preferably used.

By using such thermosetting resin (especially, cyanate resin), it is possible to reduce the thermal expansion coefficient of the prepreg 10 (hereinafter, also referred to as "it is possible to allow the prepreg 10 to have lower thermal expansivity"). In addition, it is also possible to improve electric properties of the prepreg 10 such as low-dielectric constant, low dielectric loss tangent and the like.

The cyanate resin can be obtained by, for example, a reaction of cyanogen halide and phenol to thereby produce a prepolymer. If necessary, a heat treatment may be carried out during the reaction.

Specifically, examples of such cyanate resin include novolak type cyanate resin, bisphenol type cyanate resin such as bisphenol A type cyanate resin, bisphenol E type cyanate resin or tetramethylbisphenol F type cyanate resin, and the like. Among these cyanate resins, the novolak type cyanate resin is preferably used.

By using the novolak type cyanate resin, it is possible for a cured first resin composition constituting a cured first resin layer 2 in an obtained substrate to have an increased crosslink density, thereby improving heat resistance and flame retardancy of the cured first resin layer 2 (obtained substrate).

In this regard, it can be supposed that the improved heat resistance is achieved due to existence of triazine rings formed in the cured first resin composition by the curing reaction of the novolak type cyanate resin.

Also, it can be supposed that the improved flame retardancy is achieved due to formation of carbonized portions in the cured first resin layer 2. This is because the novolak type cyanate resin has a high content of benzene rings due to its structure, and the benzene rings contained in the novolak type cyanate resin are easily carbonized (graphitized).

In addition, by using the novolak type cyanate resin, it is also possible for the prepreg 10 to have excellent rigidity even in the case where the prepreg 10 has a reduced thickness (e.g., 35 μm or less). The cyanate resin or a cured product thereof offers excellent rigidity particularly upon heating, and therefore an obtained substrate offers especially excellent reliability when a semiconductor element is mounted thereon.

As the novolak type cyanate resin, one represented by, for example, the following formula (I) can be used.

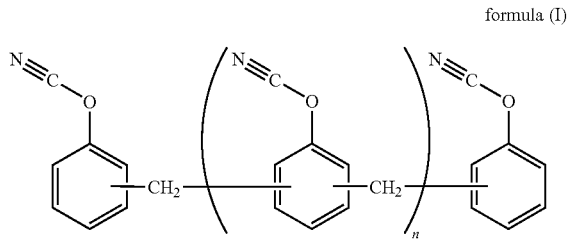

formula (I)

wherein n is any integer.

An average number of repeating units n of the novolak type cyanate resin represented by the above formula (I) is not particularly limited to a specific value, but is preferably in the range of 1 to 10, and more preferably in the range of 2 to 7.

If the average number of repeating units n is less than the above lower limit value, the novolak type cyanate resin tends to be crystallized, thereby relatively reducing solubility of the novolak type cyanate resin in general purpose-solvents.

As a result, there is a case that it is difficult to handle a varnish containing the first resin composition (that is, a varnish for forming a first resin layer) depending on an amount of the novolak type cyanate resin contained in the varnish, and the like.

In addition, in this case, since the prepregs 10 are likely to become tacky, there is also a case that when one prepreg 10 makes contact with another prepreg 10, the prepregs 10 adhere to each other, or the first resin composition of the one prepreg 10 is transferred to the another prepreg 10.

On the other hand, if the average number of repeating units n exceeds the above upper limit value, a melt viscosity of the first resin composition becomes too high, and therefore there is a case that manufacturing efficiency (moldability) of the prepreg 10 is reduced.

In this regard, it is to be noted that a weight average molecular weight of the cyanate resin or the like can be measured using, for example, a GPC (gel permeation chromatography).

In this regard, it is to be noted that the cyanate resin may be used as a prepolymer obtained by polymerizing two or more molecules of the cyanate resin. More specifically, the cyanate resin may be used singly or in combination with the prepolymer. Alternatively, two or more cyanate resins having different weight average molecular weights may be used in combination.

Such a prepolymer can be usually obtained by, for example, polymerizing three molecules of the cyanate resin (trimerizing molecules of the cyanate resin) by a heating reaction, and is preferably used to control moldability or flowability of the resin composition.

The prepolymer is not particularly limited to a specific type, but it is preferred that a prepolymer containing a trimer at an amount of 20 to 50 wt % can be used. In this regard, it is to be noted that the amount of the trimer (trimeric structure of the cyanate resin) contained in the prepolymer can be determined using, for example, an infrared spectroscopic analyzer.

In the case where the curable resin is used in combination with a curing agent or a curing accelerator which improves adhesiveness between the first resin composition and the conductor layer (which will be describer later), thermosetting resin other than the above-mentioned curable resin having good adhesiveness to the conductor layer may be used.

Examples of such a thermosetting resin include: phenolic resin such as novolak type phenolic resin (e.g., phenol novolak resin, cresol novolak resin, bisphenol A novolak resin), or resol type phenolic resin (e.g., non-modified resol phenolic resin, oil-modified resol phenolic resin modified with oil such as wood oil, linseed oil or walnut oil); epoxy resin such as bisphenol type epoxy resin (e.g., bisphenol A epoxy resin, bisphenol F epoxy resin), novolak type epoxy resin (e.g., novolak epoxy resin, cresol novolak epoxy resin), or biphenyl type epoxy resin; unsaturated polyester resin; diallyl phthalate resin; silicone resin; and the like.

In this regard, it is to be noted that as the curable resin, UV curable resin, anaerobic curable resin or the like may be used instead of the thermosetting resin or in addition to the thermosetting resin.

An amount of the curable resin contained in the first resin composition is not particularly limited to a specific value, but is preferably in the range of 5 to 50 wt %, and more preferably in the range of 10 to 40 wt % with respect to a total weight of the first resin composition.

If the amount of the curable resin contained in the first resin composition is less than the above lower limit value, there is a case that it is difficult to manufacture the prepreg 10 depending on a melt viscosity of the first resin composition and the like.

On the other hand, if the amount of the curable resin contained in the first resin composition exceeds the above upper limit value, there is a case that strength of the prepreg 10 is reduced or lowered depending on a kind of the curable resin used, a weight average molecular weight of the curable resin and the like.

Examples of a curing aid (e.g., a curing agent, a curing accelerator) which improves adhesiveness between the first resin composition and the conductor layer include: tertiary amine such as triethylamine, tributylamine, or diazabicyclo [2,2,2]octane; an imidazole compound such as 2-ethyl-4-ethylimidazole, 2-phenyl-4-methylimidazole, 2-phenyl-4-methyl-5-hydroxymethylimidazole, 2-phenyl-4,5-dihydroxymethylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, or 1-benzyl-2-phenylimidazole; and the like.

Among these curing aids, an imidazole compound having two or more functional groups each selected from an aliphatic hydrocarbon group, an aromatic hydrocarbon group, a hydroxyalkyl group, and a cyanoalkyl group is preferably used, and 2-phenyl-4,5-dihydroxymethylimidazole is more preferably used.

By using such an imidazole compound, it is possible to improve heat resistance of the first resin composition as well as to give low thermal expansivity (that is, a property such that an expansion coefficient caused by heat is low) and a low water-absorbing property to the first resin layer 2 formed of the first resin composition.

Further, in the case where the curable resin having good adhesiveness to the conductor layer is used as the curable resin, a material other than the above-mentioned curing aid which improves adhesiveness between the first resin composition and the conductor layer may be used in combination with the curable resin.

Examples of such a material include: organometallic salt such as zinc naphthenate, cobalt naphthenate, tin octylate, cobalt octylate, cobalt (II) bisacetylacetonate, or cobalt (III) triacetylacetonate; a phenol compound such as phenol, bisphenol A, or nonylphenol; organic acid such as acetic acid, benzoic acid, salicylic acid, or paratoluenesulfonic acid; and the like.

In the case where the curing aid is used, an amount of the curing aid contained in the first resin composition is not particularly limited to a specific value, but is preferably in the range of 0.01 to 3 wt %, and more preferably in the range of 0.1 to 1 wt % with respect to a total weight of the first resin composition.

If the amount of the curing aid contained in the first resin composition is less than the above lower limit value, there is a case that an effect of accelerating curing of the curable resin (first resin composition) cannot be sufficiently obtained depending on a kind of the curing aid used, and the like.

On the other hand, if the amount of the curing aid contained in the first resin composition exceeds the above upper limit value, there is a case that stability of the prepreg 10 during storage (storage stability) is reduced.

In this regard, it is to be noted that from the viewpoint of allowing the first resin layer 2 to have further improved adhesiveness to the conductor layer, the curable resin having good adhesiveness to the conductor layer is preferably used together with the curing aid which improves adhesiveness between the first resin composition and the conductor layer.

Further, the first resin composition preferably contains an inorganic filler. This makes it possible to obtain a prepreg 10 having high strength while having a reduced thickness (e.g., 35 μm or less). In addition, it is also possible to allow the prepreg 10 to have improved lower thermal expansivity.

Examples of the inorganic filler include talc, alumina, glass, silica, mica, aluminum hydroxide, magnesium hydroxide, and the like. Among these inorganic fillers, the silica is preferably used. From the viewpoint of excellent low thermal expansivity, molten silica (especially, spherical molten silica) is preferably used.

The inorganic filler (that is, the particles thereof) may have a crushed shape or a spherical shape, but a shape of the inorganic filler is appropriately selected according to its purpose of use. For example, in order to impregnate the sheet-shaped base member 1 with the first resin composition reliably, it is preferred that a melt viscosity of the first resin composition is reduced. In this case, spherical silica is preferably used as the inorganic filler.

An average particle size of the inorganic filler is not particularly limited to a specific value, but is preferably in the range of 0.01 to 5.0 μm, and more preferably in the range of 0.2 to 2.0 μm.

If the average particle size of the inorganic filler is less than the above lower limit value, there is a case that the viscosity of the first resin composition in a molten state (melt viscosity) becomes high depending on an amount of the inorganic filler contained in the first resin composition, and the like, thereby affecting workability during manufacture of the prepreg 10.

On the other hand, if the average particle size of the inorganic filler exceeds the above upper limit value, there is a case that a phenomenon such as sedimentation of the inorganic filler in a varnish for forming a first resin layer occurs.

In contrast, by setting the average particle size of the inorganic filler to a value within the above range, it is possible to exhibit the effects obtained by using the inorganic filler in a fine balance.

In this regard, it is to be noted that the average particle size of the inorganic filler can be measured by, for example, a particle size distribution analyzer ("LA-500" produced by HORIBA).

As the inorganic filler, spherical silica (especially, spherical molten silica) is preferably used. An average particle size of the spherical molten silica is preferably 5.0 μm or less, more preferably in the range of 0.01 to 2.0 μm, and most preferably in the range of 0.1 to 0.5 μm.

By using such spherical silica as the inorganic filler, it is possible to improve a filling factor (packing density) of the inorganic filler within the first resin layer 2. In addition, it is also possible to allow the first resin layer 2 to have an upper surface finely roughened, namely, it is possible to allow the upper surface of the first resin layer 2 to have a relatively small surface roughness.

This makes it possible to form the conductor layer on the first resin layer 2 in a state that these layers make close contact with each other, and therefore to easily form a circuit wiring portion (circuit wiring pattern) having a high wiring density (high-density circuit). In addition, it is also possible to form a circuit wiring portion suitable for transmitting signals high speed.

The inorganic filler to be used for the first resin composition is not particularly limited to a specific type, but it is preferred that it has an average particle size smaller than that of an inorganic filler to be used for the second resin composition (which will be described later). By using such an inorganic filler, it becomes easy to allow the first resin layer 2 to have an upper surface finely roughened.

Further, in order to improve adhesiveness between the first resin layer 2 and the conductor layer, an acid-soluble inorganic filler may also be used as the inorganic filler. By using the acid-soluble inorganic filler, it is possible to improve adhesiveness (plating adhesiveness) of the first resin layer 2 to the conductor layer in the case where the conductor layer is formed on the first resin layer 2 by a plating method.

Examples of the acid-soluble inorganic filler include calcium carbonate, metal oxide such as zinc oxide or iron oxide, and the like.

Furthermore, in order to improve adhesiveness between the first resin layer 2 and the conductor layer, the inorganic filler may be used in combination with an organic filler.

Examples of such organic filler include a resin-based filler such as liquid crystal polymer or polyimide, and the like.

In the case where the inorganic filler is used, an amount of the inorganic filler contained in the first resin composition is not particularly limited to a specific value, but is preferably in the range of 20 to 70 wt %, and more preferably in the range of 30 to 60 wt % with respect to a total weight of the first resin composition.

If the amount of the inorganic filler contained in the first resin composition is less than the above lower limit value, there is a case that an effect obtained by using the inorganic filler, which gives low thermal expansivity and a low water-absorbing property to the first resin layer 2, is reduced depending on a kind of the inorganic filler used, and the like.

On the other hand, if the amount of the inorganic filler contained in the first resin composition exceeds the above upper limit value, there is a case that flowability of the first resin composition is lowered so that moldability of the first resin layer 2 (prepreg 10) is lowered.

In contrast, by setting the amount of the inorganic filler contained in the first resin composition to a value within the above range, it is possible to exhibit the effects obtained by using the inorganic filler in a fine balance.

In the case where the cyanate resin (especially, novolak type cyanate resin) is used as the curable resin, epoxy resin (which contains substantially no halogen atom) is preferably used in combination with the cyanate resin. Examples of the epoxy resin include phenol novolak type epoxy resin, bisphenol type epoxy resin, naphthalene type epoxy resin, arylalkylene type epoxy resin, and the like.

Among these epoxy resins, the arylalkylene type epoxy resin is preferably used. By using such epoxy resin, it is possible for a cured first resin layer 2 (obtained substrate) to have improved solder heat resistance after moisture absorption and flame retardancy.

The arylalkylene type epoxy resin is epoxy resin having one or more arylalkylene groups in one repeating unit. Examples of such arylalkylene type epoxy resin include xylylene type epoxy resin, biphenyldimethylene type epoxy resin, and the like. Among these arylalkylene type epoxy resins, the biphenyldimethylene type epoxy resin is preferably used.

The biphenyldimethylene type epoxy resin can be represented by, for example, the following formula (II).

formula (II)

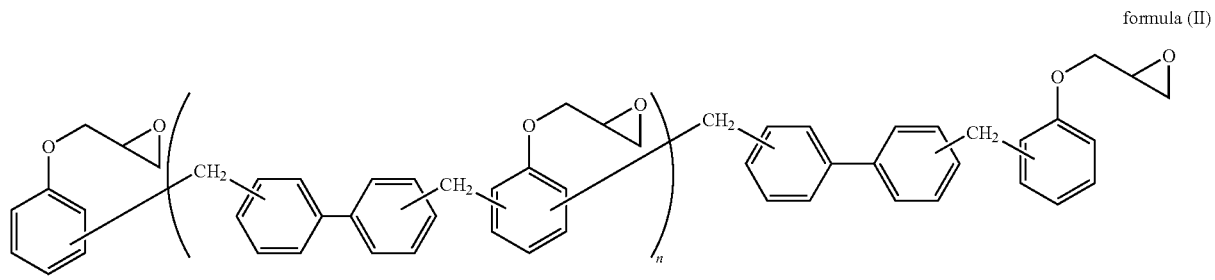

wherein n is any integer.

An average number of repeating units n of the biphenyldimethylene type epoxy resin represented by the above formula (II) is not particularly limited to a specific value, but is preferably in the range of 1 to 10, and more preferably in the range of 2 to 5.

If the average number of repeating units n is less than the above lower limit value, the biphenyldimethylene type epoxy resin tends to be crystallized, thereby reducing solubility of the biphenyldimethylene type epoxy resin in general purpose-solvents. As a result, there is a case that it becomes difficult to handle a varnish for forming a first resin layer.

On the other hand, if the average number of repeating units n exceeds the above upper limit value, there is a case that flowability of the first resin composition in a molten state is reduced, thereby causing defective molding of the prepreg 10, and the like.

In the case where a combination of the epoxy resin and the cyanate resin is used as the curable resin, an amount of the epoxy resin contained in the first resin composition is not particularly limited to a specific value, but is preferably in the range of 1 to 55 wt %, and more preferably in the range of 2 to 40 wt % with respect to a total weight of the first resin composition.

If the amount of the epoxy resin contained in the first resin composition is less than the above lower limit value, there is a case that reactivity of the cyanate resin is lowered or moisture resistance of the first resin layer 2 is lowered.

On the other hand, if the amount of the epoxy resin contained in the first resin composition exceeds the above upper limit value, there is a case that heat resistance of the first resin layer 2 is lowered depending on a kind of the epoxy resin used, and the like.

A weight average molecular weight of the epoxy resin is not particularly limited to a specific value, but is preferably in the range of 300 to 20,000, and more preferably in the range of 500 to 5,000.

If the weight average molecular weight of the epoxy resin is less than the above lower limit value, there is a case that the prepreg 10 becomes tacky depending on ambient temperature, and the like.

On the other hand, if the weight average molecular weight of the epoxy resin exceeds the above upper limit value, there is a case that it becomes difficult to impregnate the sheet-shaped base member 1 (core layer 11) with the first resin composition in the manufacturing process of the prepreg 10, and therefore a prepreg 10 having uniform thickness and uniform quality cannot be obtained.

In this regard, it is to be noted that the weight average molecular weight of the epoxy resin can be measured using, for example, a GPC (gel permeation chromatography).

The first resin composition may further contain a component (which may be resin or the like) which improves adhesiveness between the first resin layer 2 and the conductor layer. Examples of such a component include phenoxy resin, polyvinyl alcohol-based resin, a coupling agent which improves adhesiveness between the first resin layer 2 and a metal constituting the conductor layer, and the like.

Examples of the phenoxy resin include phenoxy resin having bisphenol skeletons, phenoxy resin having naphthalene skeletons, phenoxy resin having biphenyl skeletons, and the like. Alternatively, phenoxy resin having two or more kinds of these skeletons may also be used.

Among these phenoxy resins, phenoxy resin having biphenyl skeletons and bisphenol S skeletons is preferably used. Such phenoxy resin has a high glass transition temperature due to rigidity resulting from the biphenyl skeletons and has improved adhesiveness to a metal constituting the conductor layer resulting from the bisphenol S skeletons.

Therefore, by using such phenoxy resin, it is possible to improve heat resistance of the first resin layer 2 and adhesiveness between the first resin layer 2 and a plated metal when a multilayer substrate (multilayer printed wiring board) is manufactured.

Also, phenoxy resin having bisphenol A skeletons and bisphenol F skeletons is preferably used. By using such phenoxy resin, it is possible to further improve adhesiveness between the first resin layer 2 and a circuit wiring portion (inner layer circuit) when a multilayer printed wiring board is manufactured.

More preferably, the phenoxy resin having biphenyl skeletons and bisphenol S skeletons and the phenoxy resin having bisphenol A skeletons and bisphenol F skeletons are used in combination. By doing so, it is possible to allow the prepreg 10 to have properties resulting from these phenoxy resins in a fine balance.

In the case where the phenoxy resin (1) having bisphenol A skeletons and bisphenol F skeletons and the phenoxy resin (2) having biphenyl skeletons and bisphenol S skeletons are used in combination, the ratio (weight ratio) between (1) and (2) is not particularly limited to a specific value, but can be set to a range of, for example, 2:8 to 9:1.

A molecular weight of the phenoxy resin is not particularly limited to a specific value, but a weight average molecular weight of the phenoxy resin is preferably in the range of 5,000 to 70,000, and more preferably in the range of 10,000 to 60,000.

If the weight average molecular weight of the phenoxy resin is less than the above lower limit value, there is a case that it is impossible to sufficiently give an effect of improving film formability (that is, ease of film formation) to the first resin composition depending on a kind of the phenoxy resin used, and the like.

On the other hand, if the weight average molecular weight of the phenoxy resin exceeds the above upper limit value, there is a case that solubility of the phenoxy resin is reduced depending on a kind of a solvent used, and the like.

In contrast, by setting the weight average molecular weight of the phenoxy resin to a value within the above range, it is possible to exhibit the effects obtained by using the phenoxy resin in a fine balance.

In the case where the phenoxy resin is used, an amount of the phenoxy resin contained in the first resin composition is not particularly limited to a specific value, but is preferably in the range of 1 to 40 wt %, and more preferably in the range of 5 to 30 wt % with respect to a total weight of the first resin composition.

If the amount of the phenoxy resin contained in the first resin composition is less than the above lower limit value, there is a case that it is impossible to sufficiently give an effect of improving film formability (that is, ease of film formation) to the first resin composition depending on a kind of the phenoxy resin used, and the like.

On the other hand, if the amount of the phenoxy resin contained in the first resin composition exceeds the above upper limit value, an amount of the curable resin contained in the first resin composition becomes relatively small.

Therefore, in the case where the cyanate resin is used as the curable resin, there is a case that an effect of giving low thermal expansivity to the first resin layer 2 is reduced depending on a kind of the cyanate resin used, a kind of the phenoxy resin used, and the like.

In contrast, by setting the amount of the phenoxy resin contained in the first resin composition to a value within the above range, it is possible to exhibit the effects obtained by using the phenoxy resin in a fine balance.

Further, it is preferred that a coupling agent is added to (mixed with) the first resin composition. The coupling agent has a function of improving wettability of an interface between the curable resin and the inorganic filler.

Therefore, by adding such a coupling agent to the first resin composition, it is possible to uniformly fix the curable resin and the inorganic filler to the sheet-shaped base member 1. This makes it possible to improve heat resistance of the first resin layer 2, especially solder heat resistance after moisture absorption of the cured first resin layer 2.

Examples of the coupling agent include an epoxy silane coupling agent, a titanate-based coupling agent, an amino silane coupling agent, a silicone oil type coupling agent, and the like, and one or more of these coupling agents are preferably used.

By using such a coupling agent, it is possible to particularly improve the wettability of the interface between the curable resin and the inorganic filler, thereby further improving the heat resistance of the first resin layer 2.

In the case where the coupling agent is used, an amount of the coupling agent contained in the first resin composition is not particularly limited to a specific vale, but is preferably in the range of 0.05 to 3 parts by weight, and more preferably in the range of 0.1 to 2 parts by weight with respect to 100 parts by weight of the inorganic filler.

If the amount of the coupling agent contained in the first resin composition is less than the above lower limit value, there is a case that it is impossible to sufficiently cover a surface of the inorganic filler with the coupling agent depending on a kind of the coupling agent used, a kind, shape or size of the inorganic filler used, and the like, thereby reducing an effect of improving the heat resistance of the first resin layer 2.

On the other hand, if the amount of the coupling agent contained in the first resin composition exceeds the above upper limit value, there is a case that the coupling agent affects a curing reaction of the curable resin depending on a kind of the curable resin used, and the like, thereby reducing bending strength of a cured first resin layer 2 (obtained substrate).

In contrast, by setting the amount of the coupling agent contained in the first resin composition to a value within the above range, it is possible to exhibit the effects obtained by using the coupling agent in a fine balance.

If necessary, the first resin composition may further contain one or more additives such as an antifoaming agent, a leveling agent, a pigment and an antioxidant, in addition to the above-described component.

A thickness of the first resin layer 2 formed of the first resin composition is not particularly limited to a specific value, but is preferably in the range of 3 to 15 μm, and more preferably in the range of 5 to 10 μm. By setting the thickness of the first resin layer 2 to a value within the above range, it is possible to reduce a total thickness of the prepreg 10.

A surface roughness of an upper surface of the first resin layer 2, which has been subjected to a surface-roughening treatment, is not particularly limited to a specific value, but is preferably 2 μm or less, and more preferably 0.5 μm or less.

By setting the surface roughness of the upper surface of the first resin layer 2 to a value within the above range, it is possible to allow the upper surface of the first resin layer 2 to have especially excellent adhesiveness to a resist used for forming a circuit wiring portion. Therefore, it is possible to form a fine circuit wiring portion on the first resin layer 2.

Examples of the conductor layer to be formed on the first resin layer 2 include a metal foil such as a copper foil or an aluminum foil, a copper plating film, and the like. Among these conductor layers, the copper plating film is preferably used. By using such a conductor layer, it is possible to easily form a fine circuit wiring portion on the first resin layer 2.

Peel strength between the first resin layer 2 and the conductor layer (circuit wiring portion) is preferably 0.5 kN/m or more, and more preferably 0.6 kN/m or more. By setting the peel strength between the first resin layer 2 and the conductor layer to a value within the above range, it is possible to further improve connection reliability of an obtained substrate (multilayer substrate).

(Second Resin Layer)

As shown in FIG. 1, the second resin layer 3 is provided on the other surface (lower surface in FIG. 1) of the core layer 11. According to the present embodiment, as described above, the second resin layer 3 is formed of the second resin composition whose constitution is different from that of the first resin composition.

As a result, the second resin layer 3 is designed to have properties different from those of the first resin layer 2. Examples of these properties include circuit wiring portion embeddability and the like.

In this regard, it is to be noted that the phrase "a constitution of the second resin composition is different from that of the first resin composition" means that at least one of a kind of the resin or filler constituting the second resin composition, an amount of the resin or filler contained in the second resin composition, a molecular weight of the resin contained in the second resin composition, and the like is different from that of the first resin composition.

The second resin composition contains curable resin, and in addition to the curable resin it may further contain at least one of a curing agent, a curing accelerator, a filler and the like, if necessary.

Examples of the curable resin include: thermosetting resin such as phenolic resin such as novolak type phenolic resin (e.g., phenol novolak resin, cresol novolak resin, bisphenol A novolak resins), or resol type phenolic resins (e.g., non-modified resol phenolic resin, oil-modified resol phenolic resin modified with oil such as wood oil, linseed oil or walnut oil); epoxy resins such as bisphenol type epoxy resin (e.g., bisphenol A epoxy resin, bisphenol F epoxy resin), novolak type epoxy resin (e.g., novolak epoxy resin, cresol novolak epoxy resin), or biphenyl-type epoxy resin; urea resin; triazine ring-containing resin such as melamine resin; unsaturated polyester resin; bismaleimide resin; polyurethane resin; diallylphthalate resin; silicone resin; benzoxazine ring-containing resin; cyanate resin; and the like.

Among these curable resins, cyanate resin (which may be prepolymer thereof) is more preferably used. By using such curable resin (especially, cyanate resin), it is possible to reduce a thermal expansion coefficient of the prepreg 10. In addition, it is also possible to allow the prepreg 10 to have excellent electric properties such as low-dielectric constant and low dielectric loss tangent, and the like.

The cyanate resin can be obtained by, for example, a reaction of cyanogen halide and phenol to thereby produce a prepolymer. If necessary, a heat treatment may be carried out during the reaction.

Specifically, examples of such cyanate resin include novolak type cyanate resin, bisphenol type cyanate resin such as bisphenol A type cyanate resin, bisphenol E type cyanate resin or tetramethylbisphenol F type cyanate resin, and the like. Among these cyanate resins, the novolak type cyanate resin is preferably used.

By using the novolak type cyanate resin, it is possible for a cured second resin composition constituting a cured second resin layer 3 in an obtained substrate to have an increased crosslink density, thereby improving heat resistance and flame retardancy of the cured second resin layer 3 (obtained substrate).

In this regard, it can be supposed that the improved heat resistance is achieved due to existence of triazine rings formed in the cured second resin composition by the curing reaction of the novolak type cyanate resin.

Also, it can be supposed that the improved flame retardancy is achieved due to formation of carbonized portions in the cured second resin layer 3. This is because the novolak type cyanate resin has a high content of benzene rings due to its structure, and the benzene rings contained in the novolak type cyanate resin are easily carbonized (graphitized).

In addition, by using the novolak type cyanate resin, it is also possible for the prepreg 10 to have excellent rigidity even in the case where the prepreg 10 has a reduced thickness (e.g., 35 μm or less). The cyanate resin or a cured product thereof offers excellent rigidity particularly upon heating, and therefore an obtained substrate offers especially excellent reliability when a semiconductor element is mounted thereon.

As the novolak type cyanate resin, one represented by, for example, the following formula (I) can be used.

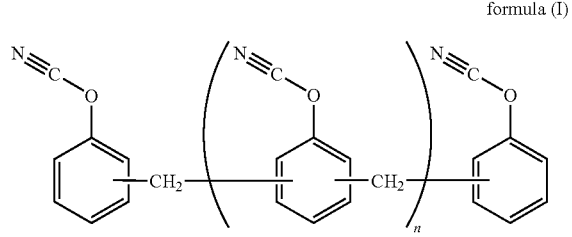

formula (I)

wherein n is any integer.

An average number of repeating units n of the novolak type cyanate resin represented by the above formula (I) is not particularly limited to a specific value, but is preferably in the range of 1 to 10, and more preferably in the range of 2 to 7.

If the average number of repeating units n is less than the above lower limit value, the novolak type cyanate resin tends to be crystallized, thereby reducing solubility of the novolak type cyanate resin in general purpose-solvents.

As a result, there is a case that it is difficult to handle a varnish containing the second resin composition (that is, a varnish for forming a second resin layer) depending on an amount of the novolak type cyanate resin contained in the varnish, and the like.

On the other hand, if the average number of repeating units n exceeds the above upper limit value, a melt viscosity of the second resin composition becomes too high, and therefore there is a case that manufacturing efficiency (moldability) of the prepreg 10 is reduced.

A weight average molecular weight of the cyanate resin is not particularly limited to a specific value, but is preferably in the range of 500 to 4,500, and more preferably in the range of 600 to 3,000.

If the weight average molecular weight of the cyanate resin is less than the above lower limit value, since the prepregs 10 are likely to become tacky, there is a case that when one prepreg 10 makes contact with another prepreg 10, the prepregs 10 adhere to each other, or the second resin composition of the one prepregs 10 is transferred to the another prepreg 10.

On the other hand, if the weight average molecular weight of the cyanate resin exceeds the above upper limit value, there is a case that a reaction rate of the cyanate resin becomes too high, thereby causing defective molding of a substrate (especially, circuit substrate) or lowering interlayer peel strength of the substrate.

In this regard, it is to be noted that the weight average molecular weight of the cyanate resin can be measured using, for example, a GPC (gel permeation chromatography).

Further, the cyanate resin may be used in combination with another cyanate resin having a different weight average molecular weight. By doing so, there is a case that a tackiness of the prepreg 10 can be improved. In this regard, it is to be noted that as the curable resin, UV curable resin, anaerobic curable resin or the like may be used, in addition to the thermosetting resin.

An amount of the curable resin contained in the second resin composition is not particularly limited to a specific value, but is preferably in the range of 5 to 50 wt %, and more preferably in the range of 20 to 40 wt % with respect to a total weight of the second resin composition.

If the amount of the curable resin contained in the second resin composition is less than the above lower limit value, there is a case that it becomes difficult to form the prepreg 10 depending on a melt viscosity of the second resin composition and the like.

On the other hand, if the amount of the curable resin contained in the second resin composition exceeds the above upper limit value, there is a case that mechanical strength of the prepreg 10 is lowered depending on a kind of the curable resin used, a weight average molecular weight of the curable resin and the like.

The second resin composition preferably contains an inorganic filler. This makes it possible to obtain a prepreg 10 having high mechanical strength while having a reduced thickness (e.g., 35 μm or less). In addition, it is also possible to allow the prepreg 10 to have lower thermal expansivity.

Examples of the inorganic filler include talc, alumina, glass, silica, mica, aluminum hydroxide, magnesium hydroxide, and the like. Among these inorganic fillers, the silica is preferably used. From the viewpoint of excellent low thermal expansivity, molten silica (especially, spherical molten silica) is preferably used.

The inorganic filler (that is, the particles thereof) may have a crushed shape or a spherical shape, but a shape of the inorganic filler is appropriately selected according to its purpose of use. For example, in order to impregnate the sheet-shaped base member 1 with the second resin composition reliably, it is preferred that a melt viscosity of the second resin composition is reduced. In this case, spherical silica is preferably used as the inorganic filler.

An average particle size of the inorganic filler is not particularly limited to a specific value, but is preferably in the range of 0.01 to 5.0 μm, and more preferably in the range of 0.2 to 2.0 μm.

If the average particle size of the inorganic filler is less than the above lower limit value, there is a case that the melt viscosity of the second resin composition becomes high depending on an amount of the inorganic filler contained in the second resin composition, and the like, thereby affecting workability during manufacture of the prepreg 10.

On the other hand, if the average particle size of the inorganic filler exceeds the above upper limit value, there is a case that a phenomenon such as sedimentation of the inorganic filler in a varnish for forming a second resin layer occurs.

In this regard, it is to be noted that the average particle size of the inorganic filler can be measured by, for example, a particle size distribution analyzer ("LA-500" produced by HORIBA).

As the inorganic filler, spherical silica (especially, spherical molten silica) is preferably used. An average particle size of the spherical molten silica is preferably 5.0 μm or less, and more preferably in the range of 0.01 to 2.0 μm. By using such spherical silica as the inorganic filler, it is possible to improve a filling factor (packing density) of the inorganic filler within the second resin layer 3.

In the case where the inorganic filler is used, an amount of the inorganic filler contained in the second resin composition is not particularly limited to a specific value, but is preferably in the range of 40 to 80 wt %, more preferably in the range of 50 to 70 wt %, and even more preferably in the range of 60 to 70 wt % with respect to a total weight of the second resin composition.

By setting the amount of the inorganic filler contained in the second resin composition to a value within the above range, it is possible to give especially excellent low thermal expansivity and low water-absorption properties to the second resin layer 3.

In the case where the cyanate resin (especially, novolak type cyanate resin) is used as the curable resin, epoxy resin (which contains substantially no halogen atom) is preferably used in combination with the cyanate resin. Examples of the epoxy resin include phenol novolak type epoxy resin, bisphenol type epoxy resin, naphthalene type epoxy resin, arylalkylene type epoxy resin, and the like.

Among these epoxy resins, the arylalkylene type epoxy resin is preferably used. By using such epoxy resin, it is possible for the cured second resin layer 3 (obtained substrate) to have improved solder heat resistance after moisture absorption and flame retardancy.

The arylalkylene type epoxy resin is epoxy resin having one or more arylalkylene groups in one repeating unit. Examples of such arylalkylene type epoxy resin include xylylene type epoxy resin, biphenyldimethylene type epoxy resin, and the like. Among these arylalkylene type epoxy resins, the biphenyldimethylene type epoxy resin is preferably used.

The biphenyldimethylene type epoxy resin can be represented by, for example, the following formula (II).

If the amount of the epoxy resin contained in the second resin composition is less than the above lower limit value, there is a case that reactivity of the cyanate resin is lowered or moisture resistance of the prepreg 10 is lowered.

On the other hand, if the amount of the epoxy resin contained in the second resin composition exceeds the above upper limit value, there is a case that heat resistance of the prepreg 10 is lowered depending on a kind of the epoxy resin used, and the like.

A weight average molecular weight of the epoxy resin is not particularly limited to a specific value, but is preferably in the range of 500 to 20,000, and more preferably in the range of 800 to 15,000.

If the weight average molecular weight of the epoxy resin is less than the above lower limit value, there is a case that the prepreg 10 becomes tacky depending on ambient temperature, and the like.

On the other hand, if the weight average molecular weight of the epoxy resin exceeds the above upper limit value, there is a case that it becomes difficult to impregnate the sheet-shaped base member 1 (core layer 11) with the second resin composition in the manufacturing process of the prepreg 10 formula (II)

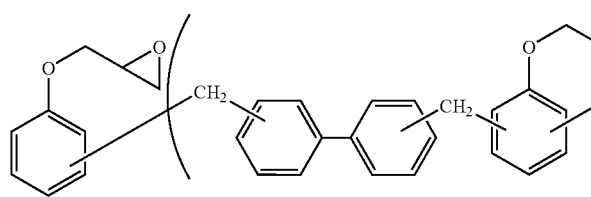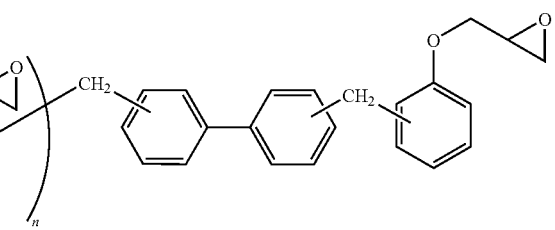

wherein n is any integer.

An average number of repeating units n of the biphenyldimethylene type epoxy resin represented by the above formula (II) is not particularly limited to a specific value, but is preferably in the range of 1 to 10, and more preferably in the range of 2 to 5.

If the average number of repeating units n is less than the above lower limit value, the biphenyldimethylene type epoxy resin tends to be crystallized, thereby reducing solubility of the biphenyldimethylene type epoxy resin in general purpose-solvents. As a result, there is a case that it becomes difficult to handle a varnish for forming a second resin layer.

On the other hand, if the average number of repeating units n exceeds the above upper limit value, there is a case that flowability of the second resin composition in a molten state is lowered, thereby causing defective molding of the prepreg 10, and the like.

In the case where a combination of the epoxy resin and the cyanate resin is used as the curable resin, an amount of the epoxy resin contained in the second resin composition is not particularly limited to a specific value, but is preferably in the range of 1 to 55 wt %, and more preferably in the range of 2 to 40 wt % with respect to a total weight of the second resin composition.

and therefore a prepreg 10 having uniform thickness and uniform quality cannot be obtained.

In this regard, it is to be noted that the weight average molecular weight of the epoxy resin can be measured using, for example, a GPC (gel permeation chromatography).

Further, in the case where the cyanate resin (especially, novolak type cyanate resin) is used as the thermosetting resin, phenolic resin is preferably used in combination with the cyanate resin. Examples of the phenolic resin include novolak type phenolic resin, resol type phenolic resin, arylalkylene type phenolic resin, and the like.

Among these phenolic resins, the arylalkylene type phenolic resin is preferably used. By using such phenolic resin, it is possible to allow the cured second resin layer 3 (obtained substrate) to have improved solder heat resistance after moisture absorption.

Examples of the arylalkylene type phenolic resin include xylylene type phenolic resin, biphenyldimethylene type phenolic resin, and the like. The biphenyldimethylene type phenolic resin can be represented by, for example, the following formula (III).

formula (III)

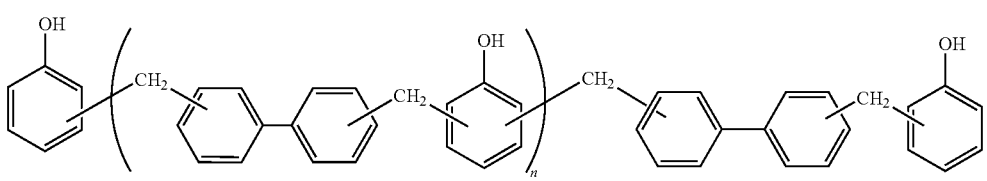

wherein n is any integer.

An average number of repeating units n of the biphenyldimethylene type phenolic resin represented by the above formula (III) is not particularly limited to a specific value, but is preferably in the range of 1 to 12, and more preferably in the range of 2 to 8.

If the average number of repeating units n of the biphenyldimethylene type phenolic resin is less than the above lower limit value, there is a case that heat resistance of the second resin layer 3 is lowered depending on an amount of the biphenyldimethylene type phenolic resin contained in the second resin composition, and the like.

On the other hand, if the average number of repeating units n of the biphenyldimethylene type phenolic resin exceeds the above upper limit value, there is a case that mutual solubility between the biphenyldimethylene type phenolic resin and another resin (curable resin) tends to be lowered, thereby lowering workability during manufacture of the prepreg 10.

By using the cyanate resin (especially, novolak type cyanate resin) in combination with the arylalkylene type phenolic resin, it is possible to control crosslink density of the cured second resin composition, thereby improving adhesiveness between a circuit wiring portion (that is, a metal constituting the circuit wiring portion) and the cured second resin layer 3 (cured second resin composition).

In the case where a combination of the phenolic resin and the cyanate resin is used as the curable resin, an amount of the phenolic resin contained in the second resin composition is not particularly limited to a specific value, but is preferably in the range of 1 to 55 wt %, and more preferably in the range of 5 to 40 wt % with respect to a total weight of the second resin composition.

If the amount of the phenolic resin contained in the second resin composition is less than the above lower limit value, there is a case that heat resistance of the second resin layer 3 is lowered depending on a kind of the phenolic resin used, and the like.

On the other hand, if the amount of the phenolic resin contained in the second resin composition exceeds the above upper limit value, there is a case that low thermal expansivity of the second resin layer 3 is impaired depending on a kind of the phenolic resin used, and the like.

A weight average molecular weight of the phenolic resin is not particularly limited to a specific value, but is preferably in the range of 400 to 18,000, and more preferably in the range of 500 to 15,000.

If the weight average molecular weight of the phenolic resin is less than the above lower limit value, there is a case that the prepreg 10 becomes tacky depending on ambient temperature, and the like.

On the other hand, if the weight average molecular weight of the phenolic resin exceeds the above upper limit value, there is a case that it becomes difficult to impregnate the sheet-shaped base member 1 (core layer 11) with the second resin composition in the manufacturing process of the prepreg 10 and therefore a prepreg 10 having uniform thickness and uniform quality cannot be obtained.

In this regard, it is to be noted that the weight average molecular weight of the phenolic resin can be measured using, for example, a GPC (gel permeation chromatography).

Further, by using the cyanate resin (especially, novolak type cyanate resin), the phenolic resin (arylalkylene type phenolic resin, especially, biphenyldimethylene type phenolic resin), and the epoxy resin (arylalkylene type epoxy resin, especially, biphenyldimethylene type epoxy resin) in combination, it is possible to obtain a prepreg 10 capable of manufacturing a substrate (especially, circuit substrate) having especially excellent dimensional stability.

The second resin composition preferably contains a coupling agent. The coupling agent has a function of improving wettability of an interface between the curable resin and the inorganic filler.

Therefore, by adding such a coupling agent to the second resin composition, it is possible to uniformly fix the curable resin and the inorganic filler to the sheet-shaped base member 1. This makes it possible to improve heat resistance of the second resin layer 3, especially, solder heat resistance after moisture absorption of the cured second resin layer 3.

The coupling agent is not particularly limited to a specific type as long as it is generally used. Examples of such a coupling agent include an epoxy silane coupling agent, a cationic silane coupling agent, an amino silane coupling agent, a titanate-based coupling agent, a silicone oil type coupling agent, and the like, and one or more of these curing agents are preferably used.

By using such a coupling agent, it is possible to enhance the wettability of the interface between the curable resin and the inorganic filler, thereby further improving the heat resistance of the second resin layer 3.

In the case where the coupling agent is used, an amount of the coupling agent contained in the second resin composition is not particularly limited to a specific value, because it can be set to a desired value depending on a surface area of the inorganic filler used.

However it is preferably in the range of 0.05 to 3 parts by weight, and more preferably in the range of 0.1 to 2 parts by weight with respect to 100 parts by weight of the inorganic filler.

If the amount of the coupling agent contained in the second resin composition is less than the above lower limit value, there is a case that it is impossible to sufficiently cover the surface of the inorganic filler with the coupling agent depending on a kind of the coupling agent used, a kind, shape or size of the inorganic filler used, and the like, thereby reducing the effect of improving the heat resistance of the second resin layer 3.

On the other hand, if the amount of the coupling agent contained in the second resin composition exceeds the above upper limit value, there is a case that the coupling agent affects a curing reaction of the curable resin depending on a kind of the curable resin used, and the like, thereby reducing bending strength of the cured second resin layer 3 (obtained substrate).

If necessary, the second resin composition may contain a curing accelerator. As the curing accelerator, a well-known one can be used. Examples of such a curing accelerator include: organometallic salt such as zinc naphthenate, cobalt naphthenate, tin octylate, cobalt octylate, cobalt (II) bisacetylacetonate, or cobalt (III) triacetylacetonate; tertiary amine such as triethylamine, tributylamine, or diazabicyclo[2,2,2]octane; imidazole such as 2-phenyl-4-methylimidazole, 2-ethyl-4-ethylimidazole, 2-phenyl-4-methylimidazole, 2-phenyl-4-methyl-5-hydroxyimidazole, or 2-phenyl-4,5-dihydroxyimidazole; a phenol compound such as phenol, bisphenol A, or nonylphenol; organic acid such as acetic acid, benzoic acid, salicylic acid, or paratoluenesulfonic acid; a mixture thereof; and the like.

In the case where the curing accelerator is used, an amount of the curing accelerator contained in the second resin composition is not particularly limited to a specific value, but is preferably in the range of 0.05 to 5 wt %, and more preferably in the range of 0.2 to 2 wt % with respect to a total weight of the second resin composition.

If the amount of the curing accelerator contained in the second resin composition is less than the above lower limit value, there is a case that an effect of accelerating a curing reaction of the curable resin cannot be sufficiently exhibited depending on a kind of the curable resin used, and the like.

On the other hand, if the amount of the curing accelerator contained in the second resin composition exceeds the above upper limit value, there is a case that storage stability of the prepreg 10 is reduced depending on a kind of the curing accelerator used, and the like.

In this regard, it is to be noted that each of the first and second resin compositions may contain thermoplastic resin to be used in combination with the curable resin. Examples of the thermoplastic resin include phenoxy resin, polyimide resin, polyamideimide resin, polyphenylene oxide resin, polyethersulfone resin, and the like.

Further, if necessary, the second resin composition may further contain one or more additives in addition to the above-described components. Examples of such additives include a pigment, an antioxidant, and the like.

A thickness of the second resin layer 3 is not particularly limited to a specific value, because it can be set to a desired value depending on a thickness of a circuit wiring portion (inner layer circuit) to be embedded into the second resin layer 3. However, a thickness represented by "t2" in the following formula 1) is preferably in the range of 0.1 to 5 μm, and more preferably in the range of 1 to 3 μm.

By setting the thickness "t2" to a value within the above range, it is possible to obtain a prepreg 10 having especially excellent embeddability of the circuit wiring portion while having a small total thickness (namely, it is possible to obtain a prepreg 10 having especially excellent moldability while having a small total thickness).

$$B1 = t1 \times (1 - S/100) + t2 \quad \text{Formula 1)}$$

Figure 2:
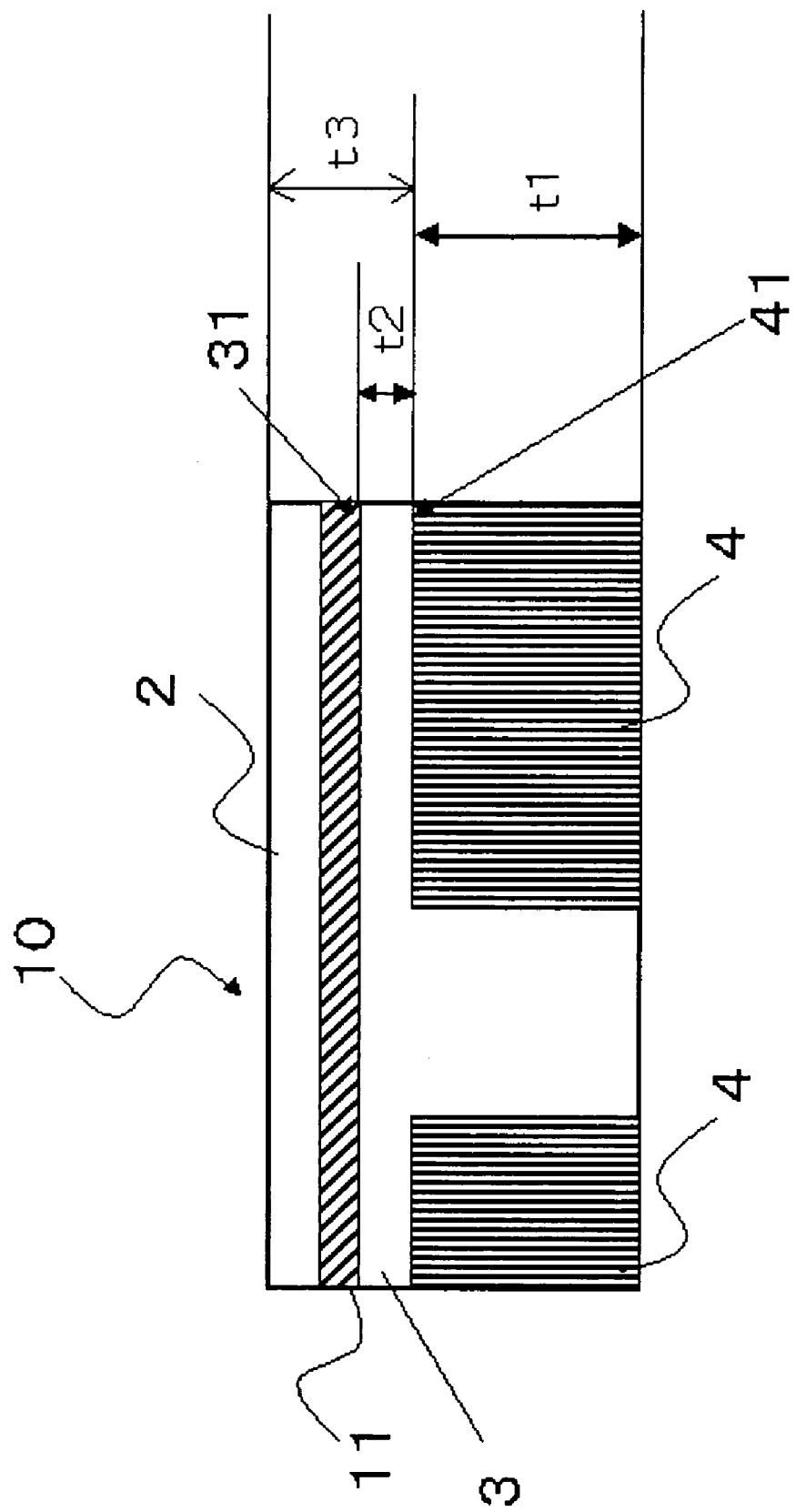
FIG. 2 is a sectional view for explaining a thickness of a second resin layer provided in the first embodiment of the prepreg.

In this formula 1), as shown in FIG. 1, a thickness of the second resin layer 3 is represented by "B1 (μm)", and as shown in FIG. 2, a thickness of a circuit wiring portion (inner layer circuit) 4 is represented by "t1 (μm)", a residual copper ratio of the circuit wiring portion 4 is represented by "S (%)", and a thickness from an upper surface 41 of the circuit wiring portion 4 to an upper surface 31 of the second resin layer 3 is represented by "t2".

In this regard, it is to be noted that in FIG. 1, the thickness of the second resin layer 3 "B1" is larger than that of the first resin layer 2 "B2" (that is, B1>B2), but according to the present embodiment, "B1" may be equal to "B2" (that is, B1=B2) or "B1" may be smaller than "B2" (that is, B1<B2).

A thermal expansion coefficient of the second resin layer 3 at a plane direction (X-Y direction) thereof is not particularly limited to a specific value, but is preferably 20 ppm or less, and more preferably in the range of 5 to 16 ppm.

By setting the thermal expansion coefficient of the second resin layer 3 in a plane direction (X-Y direction) thereof to a value within the above range, it is possible to allow the prepreg 10 to have especially excellent connection reliability and therefore to obtain a substrate which offers excellent reliability in the case where a semiconductor element or the like is mounted thereon.

The above-described prepreg 10 can be manufactured by, for example, the following method.

First, the first resin composition is applied or supplied on a carrier film (that is, a first sheet member) in the form of a layer to prepare a carrier member 2a, and the second resin composition is applied or supplied on a carrier film (that is, a second sheet member) in the form of a layer to prepare a carrier member 3a.

Next, the carrier member 2a and the carrier member 3a are laminated on (overlapped with) the sheet-shaped base member 1 (or the core layer 11), and they are joined together to obtain a laminate.

Next, if necessary, the carrier films (first and second sheet members) are removed from the laminate to thereby obtain a prepreg 10 including two resin layers formed of resin compositions having different constitutions on both surfaces of the sheet-shaped base member 1.

Hereinbelow, a method for preparing carrier members 2a and 3a each having a structure in which a resin composition is applied on a carrier film in advance, laminating the carrier members 2a and 3a on the sheet-shaped base member 1, and removing the carrier films will be specifically described based on FIG. 3.

Figure 3:
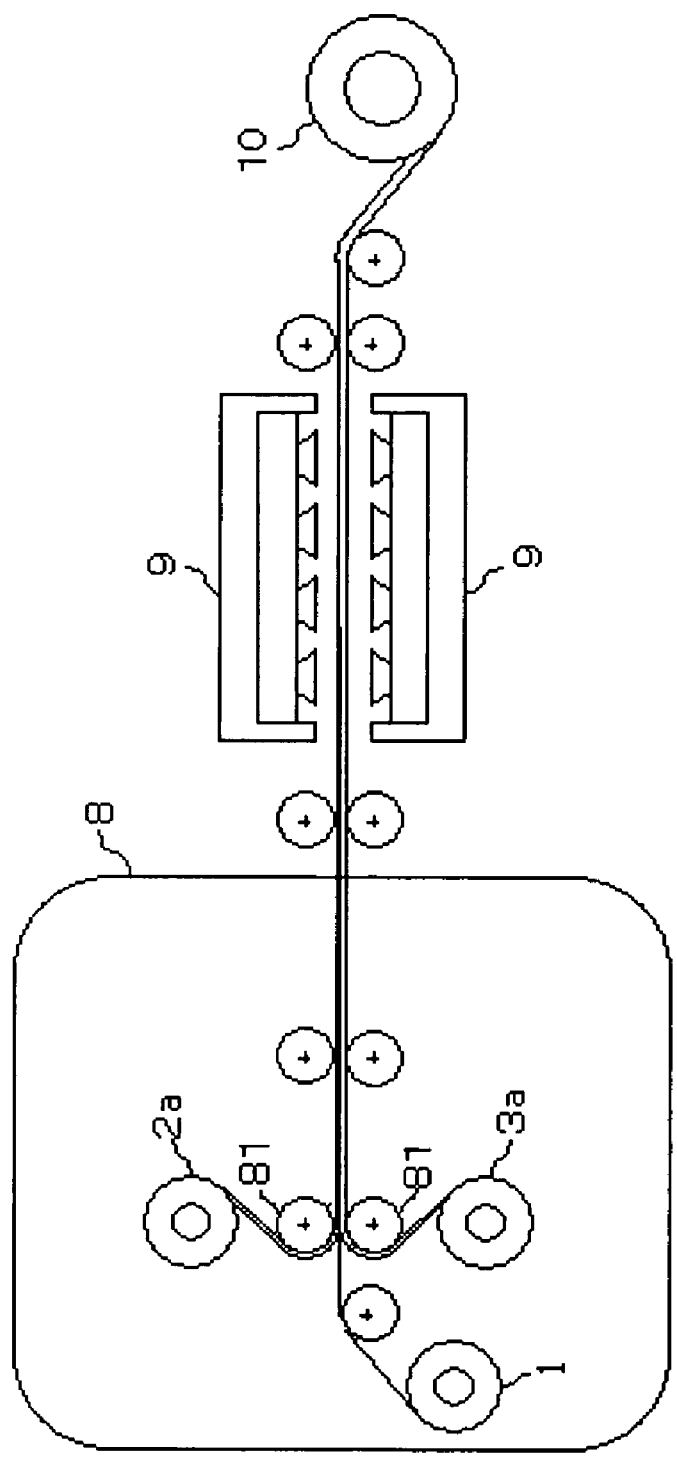
FIG. 3 is a diagram showing one example of a process for manufacturing the prepreg according to the present invention.

FIG. 3 is a diagram showing one example of a process for manufacturing a prepreg according to the present invention.

First, a sheet-shaped base member 1 (or a core layer 11), a carrier member 2a having a resin layer (first resin layer 2) formed of the first resin composition described above, and a carrier member 3a having a resin layer (second resin layer 3) formed of the second resin composition described above are prepared.

The carrier member 2a can be obtained by, for example, applying a varnish containing the first resin composition (that is, a varnish for forming a first resin layer) on a carrier film. Further, the carrier member 3a can be obtained by, for example, applying a varnish containing the second resin composition (that is, a varnish for forming a second resin layer) on a carrier film.

Next, the carrier members 2a and 3a are laminated with the sheet-shaped base member 1 using a vacuum laminator 8 so that two resin layers (first resin composition and second resin composition) make contact with both surfaces of the sheet-shaped base member 1 under reduced pressure, respectively, and the carrier members 2a and 3a and the sheet-shaped base member 1 are joined together using lamination rolls 81 to obtain a laminate.

In this regard, it is to be noted that the joining together of the sheet-shaped base member 1 and the carrier members 2a and 3a may also be carried out under normal pressure, but is preferably carried out under reduced pressure.

In the case where the joining together of the sheet-shaped base member 1 and the carrier members 2a and 3a is carried out under reduced pressure, even if non-filled portions, which are not filled by the first resin composition and the second resin composition, would be produced in the sheet-shaped base member 1 or at a joint (interface) between the sheet-shaped base member 1 and each of the carrier members 2a and 3a, the non-filled portions can exist as decompression voids or substantially vacuum voids.

Since such decompression voids or vacuum voids can be removed easily and reliably during the step of removing bubbles (e.g., heat treatment) which will be described later, a prepreg 10 to be finally obtained can be well molded without such voids (bubbles) or the like.

Such joining together of the sheet-shaped base member 1 and the carrier members 2a and 3a under reduced pressure can also be carried out using other apparatus such as a vacuum box.

After the completion of joining together of the sheet-shaped base member 1 and the carrier members 2a and 3a, the laminate is subjected to a heat treatment using a hot-air drier 9 at a temperature equal to or higher than melting points of the resin compositions constituting the carrier members 2a and 3a.

Specifically, it is preferred that the heat treatment is carried out at a temperature of a melting point or higher, wherein the melting point is a higher melting point than the melting point of the first resin composition and the melting point of the second resin composition.

By doing so, even in the case where the decompression voids or the like are produced in the step of joining the sheet-shaped base member 1 and the carrier members 2a and 3a together under reduced pressure, it is possible to remove the decompression voids or the like from the laminate. Namely, it is possible to remove bubbles from the laminate by the heat treatment.

The heat treatment can also be carried out by another method using, for example, an infrared heater, a heating roller, a flat plate type hot press machine or the like.

In this regard, it is to be noted that removal of the bubbles from the laminate can also be carried out by, for example, applying ultrasonic vibration to the laminate, instead of the heat treatment. Alternatively, the removal of the bubbles from the laminate may also be carried out by a combination of the heat treatment and the application of the ultrasonic vibration.

Next, in the case where the carrier film of each of the carrier members 2a and 3a is formed from a resin sheet, the resin sheets are removed from the laminate to obtain a prepreg 10.

In this case, it is preferred that a surface of each of the carrier films on which the resin composition is to be applied is subjected to a release treatment. By doing so, it is possible to peel off the carrier films from the resin layers (remove the carrier films from the laminate) more easily and reliably.

As described above, the prepreg 10 is adapted to be used in a state that a conductor layer is provided on the upper surface of the first resin layer 2. Therefore, in the case where the carrier film (first sheet member) of the carrier member 2a is formed of a conductive material, the carrier film may be used as the conductor layer without removing it from the laminate.

By doing so, it is possible to eliminate necessity to additionally provide a conductor layer on the upper surface of the prepreg 10 (first resin layer 2). This makes it possible to reduce a manufacturing cost of a substrate (multilayer substrate) and therefore to reduce a manufacturing cost of a semiconductor device.

In this regard, it is to be noted that by using the method described above, it is possible to easily obtain a prepreg 10 even in the case where a sheet-shaped base member 1 having a thickness of 25 μm or less is used.

Meanwhile, according to a conventional method for manufacturing a prepreg (that is, a method in which a sheet-shaped base member is immersed into and impregnated with a resin varnish using a coating machine usually used, and then is dried), it is difficult to obtain a prepreg which uses a sheet-shaped base member having a thickness of 30 μm or less.

More specifically, when such a thin sheet-shaped base member having many fine openings is passed through many transfer rolls after immersion thereof into a thermosetting resin (resin material), or an amount of a resin material to be impregnated into the sheet-shaped base member is adjusted, stress is applied to the sheet-shaped base member. As a result, there is a case that the openings of the sheet-shaped base member are enlarged or the sheet-shaped base member breaks when wound up due to the applied stress.

On the other hand, according to the method of the present invention described above, it is possible to allow the sheet-shaped base member 1 to support the carrier members 2a and 3a even in the case where it has a relatively small thickness (e.g., 25 μm or less). This makes it possible to easily obtain not only a prepreg 10 having a usual thickness but also a prepreg 10 having a relatively small thickness of 35 μm or less.

As a result, a thickness of the prepreg 10 provided between upper and lower circuit wiring portions (conductive circuit layers) in a molded substrate can be made 35 μm or less. By reducing the thickness of the prepreg 10 provided between the conductive circuit layers to 35 μm or less, it is also possible to reduce a thickness of a finally obtained substrate.

Alternatively, such a prepreg 10 can also be obtained by, for example, applying a low viscosity varnish for forming a first resin layer on one surface of a sheet-shaped base member 1, drying the varnish to form a first resin layer 2, applying a varnish for forming a second resin layer on the other surface of the sheet-shaped base member 1, and drying the varnish to form a second resin layer 3.

A thermal expansion coefficient of such a prepreg 10 in a plane direction thereof is not particularly limited to a specific value, but is preferably 16 ppm or less, more preferably 12 ppm or less, and even more preferably in the range of 5 to 10 ppm.

By setting the thermal expansion coefficient of the prepreg 10 in a plane direction thereof to a value within the above range, it is possible to allow an obtained substrate to have improved resistance to crack that is likely to be caused by repeated thermal shocks.

The thermal expansion coefficient of the prepreg 10 in a plane direction thereof can be evaluated by heating the prepreg 10 with a TMA instrument (produced by TA Instrument) at a temperature rise rate of 10° C./min.

A thickness of the prepreg 10 according to the present embodiment is not particularly limited to a specific value, but is preferably in the range of 20 to 80 μm, and more preferably in the range of 30 to 60 μm. By setting the thickness of the prepreg 10 to a value within the above range, it is possible to finally obtain a very thin substrate.

In this regard, it is to be noted that in the prepreg 10 according to the present embodiment, the sheet-shaped base member 1 may be located close to one surface of the prepreg 10 in a thickness direction thereof as in the case of a prepreg according to a second embodiment (which will be described later).

Namely, a thickness of the first resin layer 2 may be different from that of the second resin layer 3. For example, in the case where circuit wiring portions are embedded into both of the first resin layer 2 and the second resin layer 3, an amount of a resin composition for forming each of the resin layers 2 and 3 can be controlled depending on a circuit wiring portion to be embedded into (joined to) the resin layer of the prepreg 10.

In particular, in the case where a conductor layer (that is, a circuit wiring portion) is formed on the first resin layer 2, it is preferred that the thickness of the first resin layer 2 is set to a value smaller than that of the second resin layer 3. By doing so, it is possible to enhance rigidity of the first resin layer 2 and therefore to form the conductor layer more easily and reliably.

Second Embodiment

Hereinbelow, another preferred embodiment (second embodiment) of the prepreg according to the present invention will be described based on the accompanying drawings.

In this regard, it is to be noted that the prepreg according to the second embodiment will be described by focusing differences between the first and second embodiments, and a description of the overlapping points will be omitted.

Figure 4:
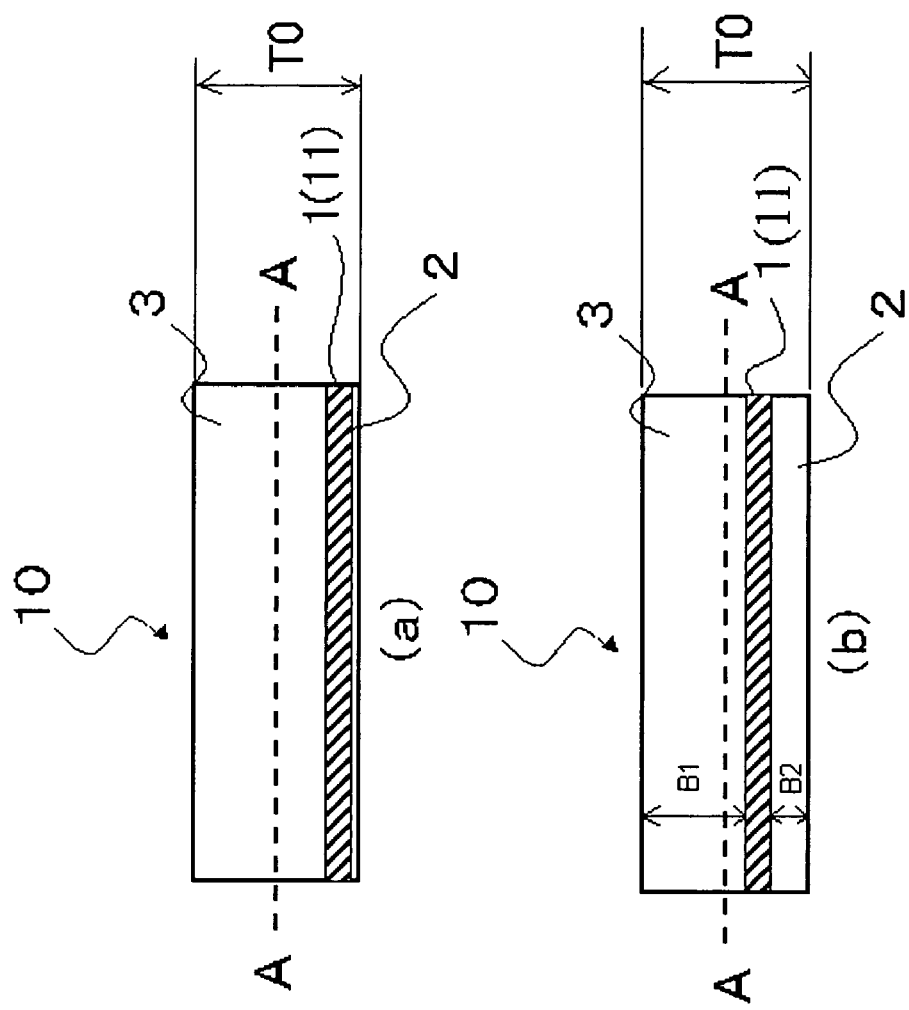
FIGS. 4(a) and 4(b) are sectional views each showing one example (second embodiment) of the prepreg according to the present invention.
Figure 5:
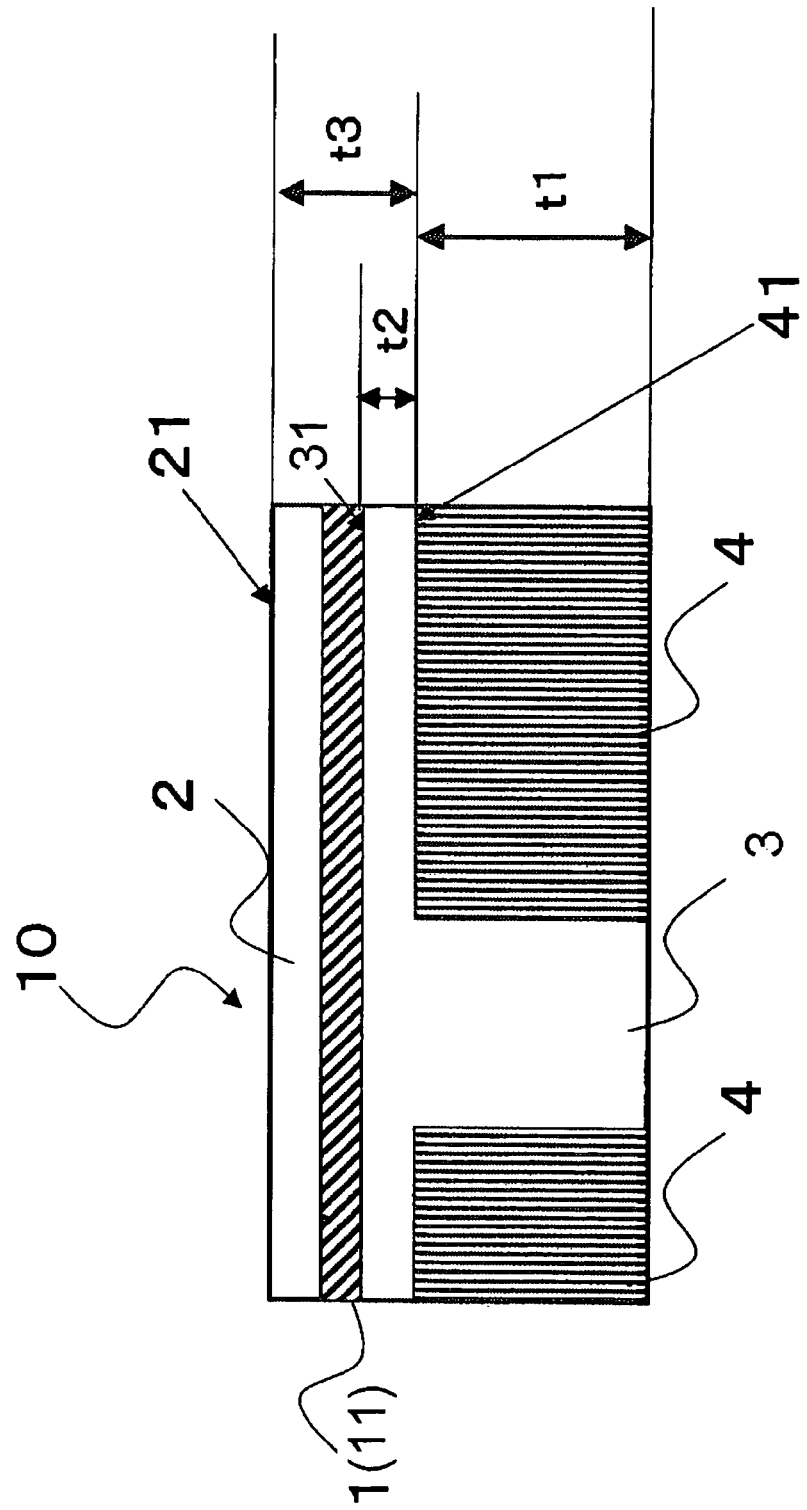
FIG. 5 is a sectional view for explaining a relationship of thicknesses of two resin layers provided in the second embodiment of the prepreg according to the present invention.

FIGS. 4(a), 4(b) and 5 are sectional views each showing one example (second embodiment) of the prepreg according to the present invention. In this regard, it is to be noted that a top and a bottom of each of FIGS. 4(a) and 4(b) are in a reversed relation with respect to those of FIG. 5.

A prepreg 10 according to the second embodiment is different from the prepreg 10 according to the first embodiment in the following points. Namely, in the prepreg 10 according to the second embodiment, a constitution of a first resin composition constituting a first resin layer 2 is identical with that of a second resin composition constituting a second resin layer 3, and a thickness of the first resin layer 2 is different from that of the second resin layer 3.

In other words, as shown in FIGS. 4(a) and 4(b), each prepreg 10 according to the second embodiment has a structure in which the same resin composition is supported on both surfaces of a sheet-shaped base member (fiber base member) 1, and the sheet-shaped base member 1 (or the core layer 11) is located close to one surface of the prepreg 10 in a thickness direction thereof.

The phrase "the sheet-shaped base member 1 (or the core layer 11) is located close to one surface of the prepreg 10 in a thickness direction thereof" used herein means a state as shown in FIGS. 4(a) and 4(b), where a center of each sheet-shaped base member 1 is dislocated from a center line A-A of the prepreg 10 in a thickness direction thereof.

As shown in FIG. 4(a), the sheet-shaped base member 1 is provided in the prepreg 10 in a state that the lower surface (lower surface in FIG. 4(a)) of the sheet-shaped base member 1 is located close to the lower surface (lower surface in FIG. 4(a)) of the prepreg 10.

On the other hand, in the prepreg 10 shown in FIG. 4(b), the sheet-shaped base member 1 is provided between a center line A-A of the prepreg 10 and the lower surface (lower surface in FIG. 4(b)) of the prepreg 10. In this regard, it is to be noted that the sheet-shaped base member 1 may be located at a position indicated by the center line A-A of the prepreg 10.

Further, a state that the sheet-shaped base member 1 is located close to one surface of the prepreg 10 in a thickness direction thereof may be a state shown in either FIG. 4(a) or FIG. 4(b), but the state shown in FIG. 4(b), that is, a state shown in FIG. 5 is more preferable.

More specifically, as shown in FIG. 4(b), when a thickness of a thick resin layer (that is, the second resin layer 3) is defined as "B1 (μm)" and a thickness of a thin resin layer (that is, the first resin layer 2) is defined as "B2 (μm)", a ratio of B2 to B1 (that is, B2/B1) is preferably larger than 0 but less than 1 (that is, 0<B2/B1<1).

Further, the ratio B2/B1 between the thickness B1 of the second resin layer 3 and the thickness B2 of the first resin layer 2 is not particularly limited to a specific value.

However, the ratio B2/B1 is preferably 0.5 or less, and more preferably in the range of 0.2 to 0.4. By setting the ratio B2/B1 to a value within the above range, it is possible to prevent the sheet-shaped base member 1 from becoming wavy and therefore to further improve flatness of the prepreg 10.

Further, the thickness B2 is not particularly limited to a specific value. However, from the viewpoint of giving plating adhesiveness to a surface (upper surface in FIG. 5) of the prepreg 10, the thickness B2 is preferably in the range of 5 to 15 μm, and more preferably in the range of 8 to 10 μm.

By setting the thickness B2 to a value within the above range, it is possible to reliably give plating adhesiveness to the upper surface (one surface) of the prepreg 10.

According to the second embodiment, the sheet-shaped base member 1 is made to have a thickness of 25 μm or less to thereby reduce the thickness of the prepreg 10. More specifically, the thickness of the sheet-shaped base member 1 is preferably 20 μm or less, and more preferably in the range of 10 to 15 μm.

By setting the thickness of the sheet-shaped base member 1 to a value within the above range, it is possible to reduce a thickness of an obtained substrate (which will be described later) while maintaining mechanical strength of the substrate.

In addition, it is also possible to obtain a prepreg 10 having excellent workability for establishing interlayer connection and therefore to allow an obtained substrate to have excellent reliability of interlayer connection.

As the sheet-shaped base member (fiber base member) 1, the same one as used in the first embodiment can be used. Further, as the resin composition, the same one as used in the second resin composition according to the first embodiment can be used. Furthermore, the prepreg 10 according to the second embodiment can be manufactured in the same manner as in the first embodiment.

However, in the case of the second embodiment, the first resin composition and the second resin composition are made to have the same constitution (composition), and the thickness of the resin layer of the carrier member 2a is made smaller than that of the resin layer of the carrier member 3a.

In this way, it is possible to obtain a prepreg 10, in which a sheet-shaped base member 1 having a relatively small thickness (e.g., 25 μm or less) is located close to one surface of the prepreg 10 in a thickness direction thereof.

By setting the thicknesses of each of the resin layers of the carrier members 2a and 3a to a desired value, it is also possible to easily reduce the thickness of the prepreg 10 to 35 μm or less.

By reducing the thickness of the prepreg 10 to 35 μm or less, it is possible to reduce a thickness of an obtained substrate, even in the case where the substrate is a multilayer substrate. This also makes it possible to reduce a thickness of a finally obtained semiconductor device.

In this regard, it is to be noted that the thickness of the prepreg 10 according to the present embodiment is not particularly limited to a specific value, but is preferably 30 μm or less, and more preferably in the range of 20 to 25 μm.

By setting the thickness of the prepreg 10 according to the present embodiment to a value within the above range, it is possible to allow an obtained substrate to have a small thickness even in the case where the substrate is a multilayer substrate having 6 or more layers. This also makes it possible to reduce a thickness of a finally obtained semiconductor device.

Meanwhile, according to a conventional prepreg manufacturing method, the same resin composition is applied on both surfaces of a sheet-shaped base member to obtain a prepreg.

More specifically, the conventional prepreg includes a sheet-shaped base member, and two resin layers provided on both surfaces thereof, respectively, the resin layers each having the same thickness and constituted of the same resin composition.

However, in the case where two different circuit wiring portions (especially, two circuit wiring portions having different residual copper ratios) are respectively embedded into the two resin layers of the conventional prepreg in a manufacturing process of a substrate, there is a case that the resin composition constituting the prepreg is squeezed out of the substrate or the resin composition cannot sufficiently fill gaps in the circuit wiring portion.

This is because the conventional prepreg cannot be suitably used respond to a situation where an amount of the resin composition required to fill the gaps in the circuit wiring portion is different between the two resin layers.

On the other hand, in the prepreg 10 according to the present embodiment, the sheet-shaped base member 1 is located close to one surface of the prepreg 10 in a thickness direction thereof.

Therefore, it is possible to design a prepreg 10 having a necessary and sufficient amount of a resin composition for filling gaps in each of two circuit wiring portions to be built up on both surfaces of the prepreg 10 (that is, two circuit wiring portions to be embedded into both resin layers).

In addition, it is also possible to manufacture a thin prepreg 10 having a thickness of 35 µm or less. Further, by locating the sheet-shaped base member 1 at a position close to one side surface of the prepreg 10 in a thickness direction thereof, it is also possible to reduce a thickness of a finally obtained semiconductor device.

This is because the prepreg 10 is simply thin and the amount of the resin composition of the prepreg 10 can be controlled depending on a residual copper ratio of a circuit wiring portion to be embedded thereinto, and therefore it becomes possible to avoid formation of resin layer containing an unnecessary amount of the resin composition.

In this regard, it is to be noted that in the prepreg 10 according to the present embodiment, the constitution of the resin composition (first resin layer 2) provided on the one surface of the sheet-shaped base member 1 may be different from that of the resin composition (second resin layer 3) provided on the other surface of the sheet-shaped base member 1 as is the case with the prepreg 10 according to the first embodiment.

The phrase "the constitution of the resin composition provided on the one surface of the sheet-shaped base member 1 may be different from that of a resin composition provided on the other surface of the sheet-shaped base member 1" herein used has the same meaning as described above with reference to the first embodiment.

By allowing the prepreg 10 to have two resin compositions having different constitutions on both surface sides thereof, it is possible to design resin layers so as to have according to desired characteristics (properties). This makes it possible to extend a range of choices of resin compositions to be used.

For example, a resin layer, into which a circuit wiring portion (inner layer circuit) is to be embedded, can be formed of a flexible resin composition in view of embeddability, and a resin layer provided on the opposite side of the above resin layer can be formed of a rigid resin composition in view of rigidity.

In this way, it is possible to give different functions to two resin layers provided on both surfaces of the prepreg 10.

Hereinbelow, a substrate having the prepreg 10 described above and a semiconductor device having such a substrate will be described.

Figure 6:
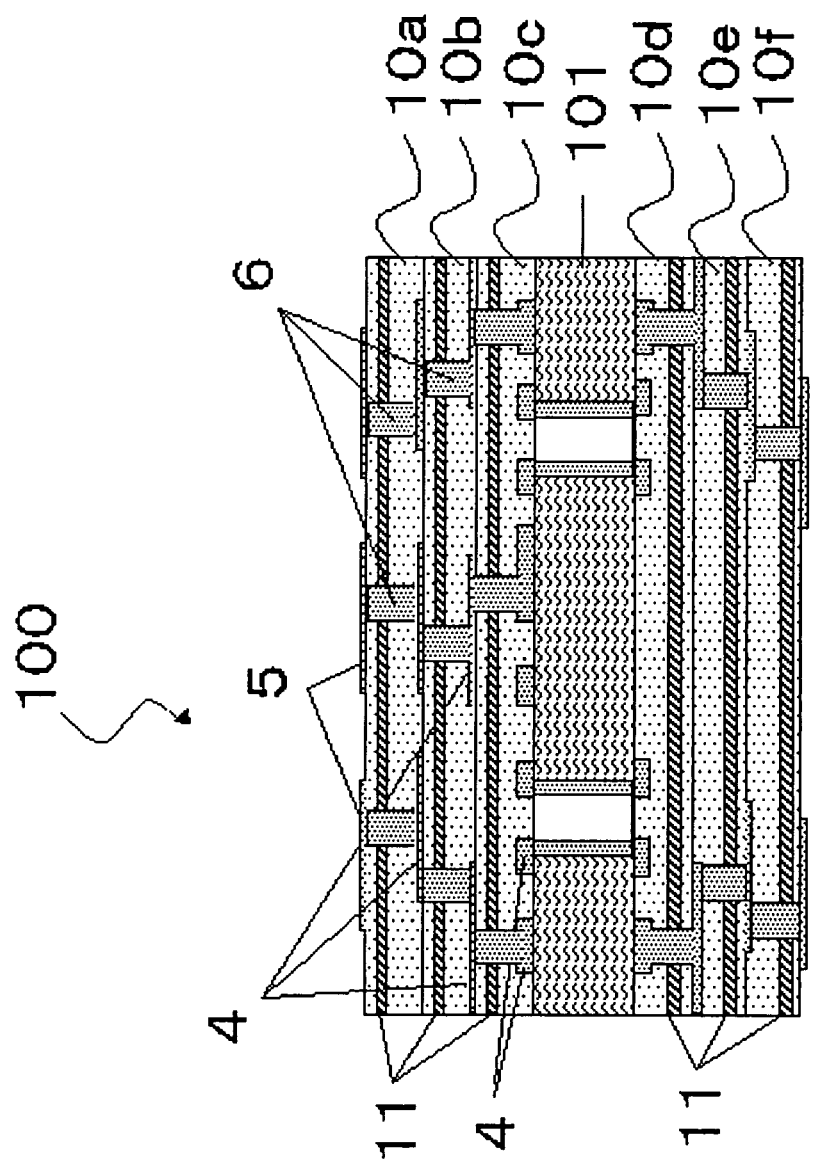
FIG. 6 is a sectional view showing one example of the substrate according to the present invention.

As shown in FIG. 6, a substrate 100 includes a core substrate 101, three prepregs 10a, 10b and 10c provided at an upper side of the core substrate 101, and three prepregs 10d, 10e and 10f provided at a lower side of the core substrate 101.

Predetermined circuit wiring portions (circuit wiring patterns) 4 are provided between the core substrate 101 and the prepreg 10c, the core substrate 101 and the prepreg 10d, the prepreg 10a and the prepreg 10b, the prepreg 10b and the prepreg 10c, the prepreg 10d and the prepreg 10e, and the prepreg 10e and the prepreg 10f. Further, pad portions 5 are provided on an upper surface of the prepreg 10a and a lower surface of the prepreg 10f.

It is preferred that at least one of these prepregs 10a to 10f (preferably, all of these prepregs 10a to 10f) is formed from the above-described prepreg 10 (e.g., the prepreg 10 having a thickness of 35 µm or less). By doing so, a thickness of the substrate (circuit substrate) 100 can be made thin.

These circuit wiring portions 4 are electrically connected by filled via portions 6 provided in the prepregs 10a to 10f and the core substrate 101 so as to pass through each of them.

Case I: each of the prepregs 10a to 10f constituting the substrate 100 is formed from the prepreg 10 according to the first embodiment.

In this case, a constitution of the first resin composition constituting the first resin layers 2 (upper resin layers of the prepregs 10a to 10c and lower resin layers of the prepregs 10d to 10f in FIG. 6), on which the circuit wiring portions (patterned conductor layers) 4 are formed, is different from that of the second resin composition constituting the second resin layers 3 each provided on the opposite side of the first resin layer 2 in each of the prepregs 10a to 10f.

The first resin composition constituting the first resin layers 2 is designed to have improved adhesiveness to a conductor layer to be provided on the first resin layer 2 of each of the prepregs 10a to 10f. This makes it possible for the first resin layers 2 to have good adhesiveness to the circuit wiring portions 4.

On the other hand, the second resin composition constituting the second resin layers 3 is designed to have improved embeddability of the circuit wiring portion 4 and low thermal expansivity.

Further, by reducing a thickness of the first resin layer 2 of each of the prepregs 10a to 10f to a minimum value required to improve adhesiveness to the circuit wiring portion 4 and by reducing a thickness of the second resin layer 3 of each of the prepregs 10a to 10f to a minimum value required to embed the circuit wiring portion 4 thereinto, it is also possible to reduce a total thickness of the substrate 100.

Case II: each of the prepregs 10a to 10f constituting the substrate 100 is formed from the prepreg 10 according to the second embodiment.

In this case, since in each of the prepregs 10a to 10f the sheet-shaped base member 1 is located close to the one surface of the prepreg in a thickness direction thereof, it is possible to provide flexibility in the structure of the limitations such as a height (thickness) of each circuit wiring portion (inner layer conductor circuit) 4 to be embedded thereinto, and the like.

This makes it possible to increase a degree of freedom of design of the circuit wiring portion 4, and therefore it is possible to form the circuit wiring portion 4 easily. In addition, it is also possible to design the prepreg 10 so that each of the second resin layers 3 has a larger thickness and this makes it possible for the circuit wiring portion 4 to be easily embedded into the second resin layer 3.

For these reasons, a risk of developing a problem caused by contact between the circuit wiring portion 4 and the sheet-shaped base member 1 can be reduced.

As shown in FIG. 5, the circuit wiring portion 4 is embedded into the resin composition of the second resin layer 3 of the prepreg 10 (e.g., prepreg 10c shown in FIGS. 6 and 7) which has a larger thickness than the first resin layer 2.

In other words, gaps (space portions) between wires constituting the circuit wiring portion 4 are filled with a part of the resin composition of the second resin layer 3.

In this regard, when a total thickness of the prepreg 10 is defined as "T0 (µm)" as shown in FIG. 4 and a height (thickness) of the circuit wiring portion 4 is defined as "t1 (µm)" as shown in FIG. 5, a difference between T0 and t1 (especially, t3) is not particularly limited to a specific value, but is preferably 35 μm or less, and more preferably in the range of 10 to 30 μm.

By setting the difference between T0 and t1 to a value within the above range, it is possible to sufficiently keep (ensure) insulation reliability of the substrate 100 even in the case where the substrate 100 is formed to have a small thickness.

Now, as shown in FIG. 5, the t3 corresponds to a thickness from an upper surface 41 of the circuit wiring portion 4 to an upper surface 21 of the prepreg 10 (that is, an upper surface of the first resin layer 2).

As shown in FIGS. 4 and 5, when a thickness of a thicker resin layer (second resin layer 3) is defined as "B1 (μm)", a thickness of a thin resin layer (first resin layer 2) is defined as "B2 (μm)", a thickness of the circuit wiring portion 4 is defined as "t1 (μm)", a residual copper ratio of the circuit wiring portion 4 is defined as "S (%)", and a thickness from the upper surface 41 of the circuit wiring portion 4 to the sheet-shaped base member 1 (that is, an upper surface 31 of the second resin layer 3) is defined as "t2 (μm)", B2 and B1 preferably satisfy a relation of B2<B1 and B1=t2+t1×(1−S/100).

In this regard, the thickness t2 is not particularly limited to a specific value, but is preferably in the range of 0 to 15 μm. In the case where there is a risk that insulation between the circuit wiring portion 4 and the sheet-shaped base member 1 is reduced so as to cause possible contact therebetween, the thickness t2 is preferably set to be a value in the range of 3 to 15 μm.

On the other hand, from the viewpoint of further reducing the thickness of the substrate 100, the thickness t2 is preferably set to a value in the range of 0 to 5 μm.

Further, from the viewpoint of achieving both of the high insulation reliability and the thickness reduction, the thickness t2 is preferably in the range of 3 to 5 μm. By setting the thickness t2 to a value within the above range, it is possible to give excellent embeddability of the circuit wiring portion 4 and high insulation reliability to the second resin layer 3.

Figure 7:
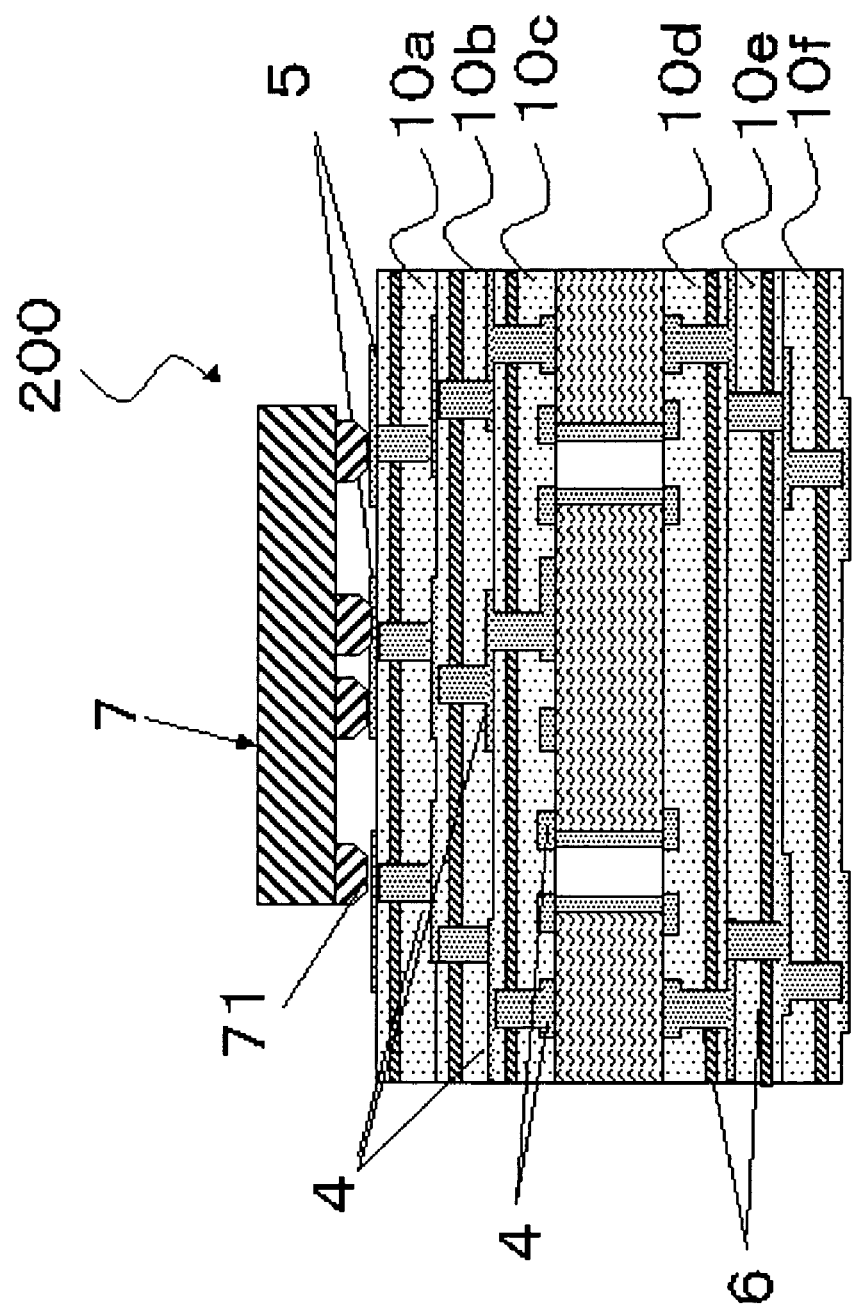
FIG. 7 is a sectional view showing one example of the semiconductor device according to the present invention.

Furthermore, as shown in FIG. 7, a semiconductor device 200 can be obtained by mounting a semiconductor element 7 on the substrate 100 in such a manner that bumps 71 of the semiconductor element 7 are connected to the pad portions 5 of the substrate 5.

By adjusting the thickness of the first resin layer 2 and the thickness of the second resin layer 3 of each of the prepregs 10a to 10f to optimum values, it is possible to optimize the total thickness of the substrate 100.

As a result, it is possible to obtain a semiconductor device 200 having a necessary and minimum thickness for satisfying required properties.

Although the substrate 100 having 6 prepregs 10a to 10f has been described above based on FIGS. 6 and 7, the substrate according to the present invention is not limited thereto. The present invention can be also applied to a substrate having 3, 4, or 5 prepregs or a multilayer substrate (multilayer wiring substrate) having 7, 8, or more prepregs.

Further, the substrate 100 according to the present invention may use both the prepreg 10 according to the first embodiment and the prepreg 10 according to the second embodiment, and may further use a conventional prepreg together with the prepreg 10 according to the first embodiment and the prepreg 10 according to the second embodiment.

In this regard, it is to be noted that in the case where two or more prepregs 10 according to the second embodiment are used, each of them may have the sheet-shaped base member 1 located in a different position in a thickness direction of the prepreg 10.

EXAMPLES

Hereinbelow, the present invention will be described in detail based on the following Examples and Comparative Examples, but the present invention is not limited to these Examples. First, Examples of the prepreg according to the present invention will be described.

Example 1

1. Preparation of Varnish for Forming First Resin Layer 24 wt % of cyanate resin having a weight average molecular weight of about 2,600 ("Primaset PT-30" produced by LONZA Japan) as thermosetting resin, 24 wt % of biphenyldimethylene type epoxy resin having an epoxy equivalent of 275 ("NC-3000" produced by Nippon Kayaku Co., Ltd.) as epoxy resin, 11.8 wt % of phenoxy resin being a copolymer of bisphenol A type epoxy resin and bisphenol F type epoxy resin, having an epoxy group at each end, and having a weight average molecular weight of 60,000 ("EP-4275" produced by Japan Epoxy Resins Co., Ltd.) as phenoxy resin, and 0.2 wt % of an imidazole compound ("2-phenyl-4,5-dihydroxymethyl imidazole" produced by Shikoku Chemicals Corporation) as a curing catalyst were dissolved into methyl ethyl ketone to obtain a mixture.

Further, 39.8 wt % of spherical molten silica having an average particle size of 0.5 μm ("SO-25H" produced by Admatechs Co., Ltd.) as an inorganic filler and 0.2 wt % of an epoxy silane type coupling agent ("A-187" produced by Nippon Unicar Co., Ltd.) were added into the mixture, and it was stirred using a high speed stirring machine for 60 minutes. In this way, a varnish for forming a first resin layer having a solid content of 60 wt % was prepared.

2. Preparation of Varnish for Forming Second Resin Layer 15 wt % of novolak type cyanate resin having an weight average molecular weight of about 2,600 ("Primaset PT-30" produced by LONZA Japan) as thermosetting resin, 8.7 wt % of biphenyldimethylene type epoxy resin having an epoxy equivalent of 275 ("NC-3000" produced by Nippon Kayaku Co., Ltd.) as epoxy resin, and 6.3 wt % of biphenyldimethylene type phenolic resin having a hydroxyl equivalent of 200 ("GPH-65" produced by Nippon Kayaku Co., Ltd.) as phenolic resin were dissolved into methyl ethyl ketone to obtain a mixture.

Further, 69.7 wt % of spherical molten silica having an average particle size of 0.5 μm ("SO-25H" produced by Admatechs Co., Ltd.) as an inorganic filler and 0.3 wt % of an epoxy silane type coupling agent ("A-187" produced by Nippon Unicar Co., Ltd.) were added into the mixture, and it was stirred using a high speed stirring machine for 60 minutes. In this way, a varnish for forming a second resin layer having a solid content of 60 wt % was prepared.

3. Preparation of Carrier Member

A polyethylene terephthalate film ("SFB-38" produced by Mitsubishi Polyester Film Corporation) having a thickness of 38 μm and a width of 480 mm was prepared as a carrier film, and the varnish for forming a first resin layer prepared above was applied on the carrier film using a comma coater and was then dried using a drier at 170° C. for 3 minutes.

In this way, a carrier member 2a was obtained. In this regard, it is to be noted that in the thus obtained carrier member 2a, a resin layer (that is, a resin layer eventually used as a first resin layer) having a thickness of 9 μm and a width of 410 mm was centrally located on the carrier film in a width direction thereof.

A carrier member 3a was obtained in the same manner as in the case of the carrier member 2a except that the varnish for forming a first resin layer was replaced with the varnish for forming a second resin layer and an amount thereof was changed.

In this regard, it is to be noted that in the thus obtained carrier member 3a, a resin layer (that is, a resin layer eventually used as a second resin layer) having a thickness of 14 μm and a width of 360 mm was centrally located on the carrier film in a width direction thereof.

4. Manufacture of Prepreg

A glass woven cloth (a cloth type thereof was #1015, a width thereof was 360 mm, a thickness thereof was 15 μm, and a basis weight thereof was 17 g/m$^2$) was prepared as a sheet-shaped base member, and a prepreg having the glass woven cloth was manufactured using a vacuum laminator and a hot air drier shown in FIG. 3.

More specifically, the carrier member 2a was laminated on one surface of the glass woven cloth and the carrier member 3a was laminated on the other surface of the glass woven cloth so that the carrier members 2a and 3a are centrally located in a width direction of the glass woven cloth, and then the carrier member 2a, the carrier member 3a, and the glass woven cloth were joined together using laminating rolls at 80° C. under reduced pressure of 1330 Pa to obtain a laminate.

In this regard, it is to be noted that, in an inside area of the laminate that lay within the width of the glass woven cloth, the resin layer of the carrier member 2a was joined to the one surface of the glass woven cloth and the resin layer of the carrier member 3a was joined to the other surface of the glass woven cloth, and in an outside area of the laminate that did not lie within the width of the glass woven cloth, the resin layer of the carrier member 2a and the resin layer of the carrier member 3a were joined to each other.

Next, the thus obtained laminate was passed through a hot air drier kept at 120° C. for 2 minutes using a horizontal conveyor so that the laminate was subjected to a heat treatment without applying pressure.

Thereafter, the two carrier films were peeled off from the resin layers and removed from the laminate to thereby obtain a prepreg having a thickness of 30 μm (a thickness of the first resin layer was 5 μm, a thickness of the glass woven cloth was 15 μm and a thickness of the second resin layer was 10 μm).

Example 2

A prepreg was obtained in the same manner as in the Example 1 except that the varnish for forming a first resin layer was replaced with one prepared in the following manner. In this Example 2, a varnish for forming a first resin layer was prepared without using the cyanate resin as the thermosetting resin.

Namely, 24 wt % of biphenyldimethylene type epoxy resin having an epoxy equivalent of 275 ("NC-3000" produced by Nippon Kayaku Co., Ltd.) and 17.5 wt % of liquid bisphenol type epoxy resin ("830S" produced by DAINIPPON INK AND CHEMICALS, INC.) as epoxy resins, 18 wt % of phenoxy resin being a copolymer containing bisphenol S skeletons (chemical structures), having an epoxy group at each end, and having a weight average molecular weight of 30,000 ("YX-8100" produced by Japan Epoxy Resins Co., Ltd.) as phenoxy resin, and 0.2 wt % of an imidazole compound ("2-phenyl-4,5-dihydroxymethyl imidazole" produced by Shikoku Chemicals Corporation) as a curing catalyst were dissolved in methyl ethyl ketone to obtain a mixture.

Further, 39.8 wt % of spherical molten silica having an average particle size of 0.5 μm ("SO-25H" produced by Admatechs Co., Ltd.) as an inorganic filler and 0.2 wt % of an epoxy silane type coupling agent ("A-187" produced by Nippon Unicar Co., Ltd.) were added into the mixture, and it was stirred using a high speed stirring machine for 60 minutes. In this way, a varnish for forming a first resin layer having a solid content of 60 wt % was prepared.

In this regard, it is to be noted that the thus obtained prepreg had a thickness of 30 μm (a thickness of the first resin layer was 5 μm, a thickness of the glass woven cloth was 15 μm and a thickness of the second resin layer was 10 μm).

Example 3

A prepreg was obtained in the same manner as in the Example 1 except that the varnish for forming a second resin layer was replaced with one prepared in the following manner.

17.5 wt % of biphenyldimethylene type epoxy resin having an epoxy equivalent of 275 ("NC-3000" produced by Nippon Kayaku Co., Ltd.) as epoxy resin and 12 wt % of biphenyldimethylene type phenolic resin having a hydroxyl equivalent of 200 ("GPH-65" produced by Nippon Kayaku Co., Ltd.) as phenolic resin as thermosetting resins, 0.5 wt % of imidazole ("2P4 MHZ" produced by Shikoku Chemicals Corporation), and an epoxy silane type coupling agent ("A-187" produced by Nippon Unicar Co., Ltd.) as a coupling agent in an amount of 0.3 part by weight per 100 parts by weight of total inorganic fillers (which will be described later) were dissolved into methyl ethyl ketone at room temperature to obtain a mixture.

Further, 20 wt % of spherical molten silica having an average particle size of 0.3 μm ("SFP-10X" produced by Denki Kagaku Kogyo K. K.) and 50 wt % of spherical molten silica having an average particle size of 1.5 μm ("SO-32R" produced by Admatechs Co., Ltd.) as inorganic fillers were added into the mixture, and it was stirred using a high speed stirring machine for 10 minutes. In this way, a varnish for forming a second resin layer was prepared.

In this regard, it is to be noted that the thus obtained prepreg had a thickness of 30 μm (a thickness of the first resin layer was 5 μm, a thickness of the glass woven cloth was 15 μm and a thickness of the second resin layer was 10 μm).

Example 4

A prepreg was obtained in the same manner as in the Example 1 except that the thickness of the resin layer of the carrier member 2a was changed to 14 μm and the thickness of the resin layer of the carrier member 3a was changed to 14 μm.

In this regard, it is to be noted that the thus obtained prepreg had a thickness of 35 μm (a thickness of the first resin layer was 10 μm, a thickness of the glass woven cloth was 15 μm and a thickness of the second resin layer was 10 μm).

Example 5

A prepreg was obtained in the same manner as in the Example 1 except that the sheet-shaped base member and the carrier members 2a and 3a were changed in the following manner.

The sheet-shaped base member was changed to a glass woven cloth (a cloth type thereof was #1037, a thickness thereof was 24 μm, and a basis weight thereof was 24 g/m$^2$).

Further, the thickness of the resin layer of the carrier member 2a was changed to 12 μm and the thickness of the resin layer of the carrier member 3a was changed to 18 μm.

In this regard, it is to be noted that the thus obtained prepreg had a thickness of 40 μm (a thickness of the first resin layer was 5 μm, a thickness of the glass woven cloth was 24 μm and a thickness of the second resin layer was 11 μm).

Example 6

A prepreg was obtained in the same manner as in the Example 1 except that the sheet-shaped base member and the carrier members 2a and 3a were changed in the following manner.

The sheet-shaped base member was changed to a glass woven cloth (a cloth type thereof was #1080, a thickness thereof was 42 μm, and a basis weight thereof was 48 g/m$^2$).

Further, the thickness of the resin layer of the carrier member 2a was changed to 20 μm and the thickness of the resin layer of the carrier member 3a was changed to 22 μm.

In this regard, it is to be noted that the thus obtained prepreg had a thickness of 60 μm (a thickness of the first resin layer was 8 μm, a thickness of the glass woven cloth was 42 μm and a thickness of the second resin layer was 10 μm).

Example 7

A prepreg was obtained in the same manner as in the Example 1 except that the varnish for forming a second resin layer was replaced with the varnish for forming a first resin layer prepared in the Example 1. Namely, a constitution of the first resin composition and a constitution of the second resin composition were the same.

In this regard, it is to be noted that the thus obtained prepreg had a thickness of 30 μm (a thickness of the first resin layer was 5 μm, a thickness of the glass woven cloth was 15 μm and a thickness of the second resin layer was 10 μm).

Example 8

A prepreg was obtained in the same manner as in the Example 1 except that the varnish for forming a first resin layer was replaced with the varnish for forming a second resin layer prepared in the Example 1. Namely, a constitution of the first resin composition and a constitution of the second resin composition were the same.

In this regard, it is to be noted that the thus obtained prepreg had a thickness of 30 μm (a thickness of the first resin layer was 5 μm, a thickness of the glass woven cloth was 15 μm and a thickness of the second resin layer was 10 μm).

Example 9

1. Preparation of Varnish for Forming Resin Layer 15 wt % of novolak type cyanate resin having a weight average molecular weight of about 2,600 ("Primaset PT-30" produced by LONZA Japan) as thermosetting resin, 8 wt % of biphenyldimethylene type epoxy resin having an epoxy equivalent of 275 ("NC-3000P" produced by Nippon Kayaku Co., Ltd.) as epoxy resin, 7 wt % of biphenyldimethylene type phenolic resin having a hydroxyl equivalent of 203 ("MEH-7851-S" produced by Meiwa Plastic Industries, Ltd.) as phenolic resin, and an epoxy silane type coupling agent ("A-187" produced by Nippon Unicar Co., Ltd.) as a coupling agent in an amount of 0.3 part by weight per 100 parts by weight of total inorganic fillers (which will be described later) were dissolved into methyl ethyl ketone at room temperature to obtain a mixture.

Further, 20 wt % of spherical molten silica having an average particle size of 0.3 μm ("SFP-10X" produced by Denki Kagaku Kogyo K. K.) and 50 wt % of spherical molten silica having an average particle size of 1.5 μm ("SO-32R" produced by Admatechs Co., Ltd.) as inorganic fillers were added into the mixture, and it was stirred using a high speed stirring machine for 10 minutes. In this way, a varnish for forming a resin layer was prepared.

2. Preparation of Carrier Member

A polyethylene terephthalate film ("SFB-38" produced by Mitsubishi Polyester Film Corporation) having a thickness of 38 μm and a width of 480 mm was prepared as a carrier film, and the varnish for forming a resin layer prepared above was applied on the carrier film using a comma coater and was then dried using a drier at 170° C. for 3 minutes.

In this way, a carrier member 2a was obtained. In this regard, it is to be noted that in the thus obtained carrier member 2a, a resin layer (that is, a resin layer eventually used as a first resin layer) having a thickness of 8 μm and a width of 360 mm was centrally located on the carrier film in a width direction thereof.

A carrier member 3a was obtained in the same manner as in the case of the carrier member 2a except that an amount of the varnish applied on the carrier film was changed.

In this regard, it is to be noted that in the thus obtained carrier member 3a, a resin layer (that is, a resin layer eventually used as a second resin layer) having a thickness of 15 μm and a width of 410 mm was centrally located on the carrier film in a width direction thereof.

3. Manufacture of Prepreg

A glass woven cloth (a cloth type thereof was #1015, a width thereof was 360 mm, a thickness thereof was 15 μm, and a basis weight thereof was 17 g/m$^2$) was prepared as a sheet-shaped base member, and a prepreg using the glass woven cloth was manufactured using a vacuum laminator and a hot air drier shown in FIG. 3.

More specifically, the carrier member 2a was laminated on one surface of the glass woven cloth and the carrier member 3a was laminated on the other surface of the glass woven cloth so that the carrier members 2a and 3a are centrally located in a width direction of the glass woven cloth, and then the carrier member 2a, the carrier member 3a, and the glass woven cloth were joined together using laminating rolls at 80° C. under reduced pressure of 750 Torr to obtain a laminate.

In this regard, it is to be noted that, in an inside area of the laminate which lay within the width of the glass woven cloth, the resin layer of the carrier member 2a was joined to the one surface of the glass woven cloth and the resin layer of the carrier member 3a was joined to the other surface of the glass woven cloth, and in an outside area of the laminate which did not lie within the width of the glass woven cloth, the resin layer of the carrier member 2a and the resin layer of the carrier member 3a were joined to each other.

Next, the thus obtained laminate was passed through a hot air drier kept at 120° C. for 2 minutes using a horizontal conveyor so that the laminate was subjected to a heat treatment without applying pressure.

Thereafter, the two carrier films were peeled off from the resin layers and removed from the laminate to thereby obtain a prepreg having a thickness of 30 μm (a thickness of the first resin layer was 4 μm, a thickness of the glass woven cloth was 15 μm and a thickness of the second resin layer was 11 μm).

Example 10

A prepreg was obtained in the same manner as in the Example 9 except that the thickness of the resin layer of the carrier member 2a was changed to 8 μm and the thickness of the resin layer of the carrier member 3a was changed to 20 μm.

In this regard, it is to be noted that the thus obtained prepreg had a thickness of 35 μm (a thickness of the first resin layer was 4 μm, a thickness of the glass woven cloth was 15 μm and a thickness of the second resin layer was 16 μm).

Example 11

A prepreg was obtained in the same manner as in the Example 9 except that the sheet-shaped base member and the carrier members 2a and 3a were changed in the following manner.

The sheet-shaped base member was changed to a glass woven cloth (a cloth type thereof was #1037, a thickness thereof was 24 μm, and a basis weight thereof was 24 g/m$^2$).

Further, the thickness of the resin layer of the carrier member 2a was changed to 11 μm and the thickness of the resin layer of the carrier member 3a was changed to 20 μm.

In this regard, it is to be noted that in the thus obtained prepreg had a thickness of 40 μm (a thickness of the first resin layer was 4 μm, a thickness of the glass woven cloth was 24 μm and a thickness of the second resin layer was 12 μm).

Example 12

A prepreg was obtained in the same manner as in the Example 9 except that the varnish for forming a resin layer was replaced with one prepared in the following manner.

100 parts by weight of epoxy resin ("Ep5048" produced by Japan Epoxy Resins Co., Ltd.) as thermosetting resin, 2 parts by weight of a curing agent (dicyandiamide), and 0.1 part by weight of a curing accelerator (2-ethyl-4-methyl imidazole) were dissolved into 100 parts by weight of methyl cellosolve to thereby obtain a varnish for forming a resin layer.

In this regard, it is to be noted that the thus obtained prepreg had a thickness of 35 μm (a thickness of the first resin layer was 4 μm, a thickness of the glass woven cloth was 15 μm and a thickness of the second resin layer was 16 μm).

Example 13

A prepreg was obtained in the same manner as in the Example 9 except that the carrier members 2a and 3a were changed in the following manner.

The thickness of the resin layer of the carrier member 2a was changed to 8 μm and the thickness of the resin layer of the carrier member 3a was changed to 25 μm.

In this regard, it is to be noted that the thus obtained prepreg had a thickness of 40 μm (a thickness of the first resin layer was 4 μm, a thickness of the glass woven cloth was 15 μm and a thickness of the second resin layer was 21 μm).

Comparative Example 1

A prepreg was obtained in the same manner as in the Example 9 except that the sheet-shaped base member and the carrier members 2a and 3a were changed in the following manner.

The sheet-shaped base member was changed to a glass woven cloth (a cloth type thereof was #1080, a thickness thereof was 55 Mm, and a basis weight thereof was 47 g/m$^2$).

Further, the thickness of the resin layer of the carrier member 2a was changed to 25 μm and the thickness of the resin layer of the carrier member 3a was changed to 25 μm.

In this regard, it is to be noted that in the thus obtained prepreg had a thickness of 75 μm (a thickness of the first resin layer was 10 μm, a thickness of the glass woven cloth was 55 μm and a thickness of the second resin layer was 10 μm).

Comparative Example 2

A prepreg was obtained in the same manner as in the Example 9 except that the sheet-shaped base member and the carrier members 2a and 3a were changed in the following manner.

The sheet-shaped base member was changed to a glass woven cloth (a cloth type thereof was #1037, a thickness thereof was 24 μm, and a basis weight thereof was 24 g/m$^2$).

Further, the thickness of the resin layer of the carrier member 2a was changed to 16 μm and the thickness of the resin layer of the carrier member 3a was changed to 16 μm.

In this regard, it is to be noted that in the thus obtained prepreg had a thickness of 40 μm (a thickness of the first resin layer was 8 μm, a thickness of the glass woven cloth was 24 μm and a thickness of the second resin layer was 8 μm).

The prepregs obtained in the Examples 1 to 13 and the Comparative Examples 1 and 2 were evaluated in the following manner.

1. Ratio of Thickness of First Resin Layer and Thickness of Second Resin Layer

The thickness of each resin layer of the prepreg was measured in a cross section of the prepreg.

2. Thermal Expansion Coefficient of Prepreg in Plane Direction

A thermal expansion coefficient of the prepreg in a plane direction thereof was measured using a TMA instrument (produced by TA Instrument) at a temperature rise rate of 10° C./min.

3. Elastic Modulus of Prepreg

An elastic modulus of the prepreg was measured by DMA ("DMA 983" produced by TA Instrument) in a resonant shear mode at a temperature rise rate of 5° C./min.

These evaluation items and evaluation results are shown in Table 1.

TABLE 1

|  | T0 [μm] | B1 [μm] | B2 [μm] | Ratio of Thicknesses (B2/B1) | Thermal Expansion Coefficient [ppm] | Elastic Modulus [MPa] |
|---|---|---|---|---|---|---|
| Example 1 | 30 | 10 | 5 | 0.50 | 11 | 24 |
| Example 2 | 30 | 10 | 5 | 0.50 | 12 | 22 |
| Example 3 | 30 | 10 | 5 | 0.50 | 15 | 20 |
| Example 4 | 35 | 10 | 10 | 1.00 | 12 | 23 |
| Example 5 | 40 | 11 | 5 | 0.45 | 11 | 24 |

TABLE 1-continued

| | T0 [μm] | B1 [μm] | B2 [μm] | Ratio of Thicknesses (B2/B1) | Thermal Expansion Coefficient [ppm] | Elastic Modulus [MPa] |
|---|---|---|---|---|---|---|
| Example 6 | 60 | 10 | 8 | 0.80 | 12 | 25 |
| Example 7 | 30 | 10 | 5 | 0.50 | 15 | 22 |
| Example 8 | 30 | 10 | 5 | 0.50 | 8 | 25 |
| Example 9 | 30 | 11 | 4 | 0.36 | 8 | 25 |
| Example 10 | 35 | 16 | 4 | 0.25 | 10 | 24 |
| Example 11 | 40 | 12 | 4 | 0.33 | 8 | 25 |
| Example 12 | 35 | 16 | 4 | 0.25 | 12 | 22 |
| Example 13 | 40 | 21 | 4 | 0.19 | 10 | 24 |
| Comparative Example 1 | 75 | 10 | 10 | 1.00 | 8 | 26 |
| Comparative Example 2 | 40 | 8 | 8 | 1.00 | 8 | 25 |

As can be seen from Table 1, each of the prepregs of the Examples 1 to 3 and 5 to 13 had the first resin layer and the second resin layer having different thicknesses, and thus in each of these prepregs, the sheet-shaped base member is was located close to one surface of the prepreg in a thickness direction thereof.

Therefore, each of the prepregs could have a resin layer whose thickness can vary depending on a residual copper ratio of a circuit wiring portion to be embedded thereinto, a circuit thickness (circuit height), and the like.

Further, all of the prepregs of the Examples 1 to 13 have a low thermal expansion coefficient and a high elastic modulus. From these results, it can be expected that substrates using such prepregs will have excellent connection reliability.

I. Measurement of Thickness and Evaluation of Moldability and Plating Adhesiveness 10 multilayer substrates (substrates) were manufactured using the prepregs obtained in each of the Examples 1 to 13 and Comparative Examples 1 and 2, and then 10 semiconductor devices were manufactured using the thus obtained substrates. Each multilayer substrate and each semiconductor device were manufactured as follows.

First, a core substrate 101, on which a circuit wiring portion 4 having a comb shape was provided, was prepared. In this regard, it is to be noted that gaps between wires constituting the circuit wiring portion 4 had a width of 50 μm, and the circuit wiring portion 4 had a predetermined circuit thickness and a residual copper ratio of 50%.

Next, the prepreg was laminated on the core substrate 101 so as to make contact with circuit wiring portion 4, and a copper foil as an outermost layer was further laminated on the prepreg to obtain a laminate. And then the laminate was heated and pressure-molded under conditions of 3 MPa, 200° C. and 90 minutes to thereby obtain a multilayer substrate.

Thereafter, the copper foil (conductor layer) which was the outermost layer and had a thickness of 12 μm, was formed into a circuit, and then a semiconductor element was mounted on the circuit to thereby obtain a semiconductor device.

The thus obtained multilayer substrates using the prepregs obtained in the Examples and Comparative Examples and the semiconductor devices using these substrates were evaluated in the following points.

1. Thickness t3 (Interlayer Thickness)

A thickness t3 (that is, the thickness from the upper surface 41 of the circuit wiring portion 4 to the upper surface 21 of the first resin layer 2) of each multilayer substrate was measured by observing a cross section of the substrate.

2. Thickness t2

A thickness t2 (that is, the thickness from the upper surface 41 of the circuit wiring portion 4 to the upper surface 31 of the second resin layer 3) of each multilayer substrate was measured by observing the cross section of the substrate.

In this regard, it is to be noted that a difference of the measured value of the interlayer thickness t3 and a designed value thereof was calculated and shown in Table 2.

3. Embeddability

A cross section of the circuit wiring portion 4 in the substrate was observed with a microscope, and then embeddability of the resin layer of the prepreg was evaluated according to the following four criteria.

A: All of the substrates had excellent embeddability.

B: The circuit wiring portion 4 was made contact with the glass woven cloth partially, but which did not cause any problem in practical use of the substrate.

C: The circuit wiring portion 4 was made contact with the glass woven cloth partially, which made it impossible to practically use the substrate.

D: The resin layer was not embedded into the gaps between the wires constituting the circuit wiring portion 4 sufficiently, and therefore voids or the like were observed within the gaps.

4. Plating Adhesiveness

Plated copper peel strength of the copper foil to the first resin layer (upper resin layer) was measured for each prepreg, and then based on the measured value, plating adhesiveness of the first resin layer of the prepreg was evaluated according to the following four criteria.

A: 0.6 kN/m or more

B: 0.5 kN/m or more but less than 0.6 kN/m

C: 0.4 kN/m or more but less than 0.5 kN/m

D: less than 0.4 kN/m

II. Evaluation of Insulation Reliability

In order to test insulation reliability, 10 multilayer substrates (four-layer printed wiring boards) each provided with circuit wiring portions 4 having a comb shape as inner and outer layers thereof were manufactured using the prepregs obtained in each of the Examples and Comparative Examples. In this regard, it is to be noted that gaps between wires constituting the circuit wiring portion 4 had a width of 50 μm.

Insulation resistance of each multilayer substrate was measured using an automatic ultra-insulation resistance meter (produced by ADVANTEST). Then, a direct current of 50 V was applied to the printed wiring board for 96 hours in an atmosphere of PCT-130° C./85%, and then the insulation resistance of the multilayer substrate was measured.

Based on the measured values of the insulation resistance, the insulation reliability of the multilayer substrate was evaluated according to the following four criteria. In this regard, it is to be noted that the insulation resistance was measured under the condition that a voltage of 100 V was applied for 1 minute.

A: $1 \times 10^9 \Omega$ or more

B: $1 \times 10^8 \Omega$ or more but less than $1 \times 10^9 \Omega$

C: $1 \times 10^7 \Omega$ or more but less than $1 \times 10^8 \Omega$

D: less than $1 \times 10^7 \Omega$

III. Evaluation of Connection Reliability (Temperature Cycling (TC) Test)

10 daisy chain type semiconductor devices for evaluation use were manufactured by connecting a semiconductor element having 300 bumps to a multilayer substrate manufactured using the prepreg obtained in each of the Examples and Comparative Examples via the bumps.

Electrical continuity of each semiconductor device was checked, and then each semiconductor device was subjected to a temperature cycling (TC) test by repeating a cycle consisting of 10-minute cooling at −50° C. and 10-minute heating at 125° C.

Every 100 cycles during the TC test, a number of the semiconductor devices in which disconnection occurred was counted.

Based on the number of the semiconductor devices in which disconnection occurred, connection reliability of the semiconductor device was evaluated according to the following four criteria.

A: The number of the semiconductor devices in which disconnection occurred was 0 even after completion of 1000 cycles of the TC test.

B: The number of the semiconductor devices in which disconnection occurred was 0 after completion of 800 cycles of the TC test, but was 5 or more after completion of 1000 cycles of the TC test.

C: The number of the semiconductor devices in which disconnection occurred was 0 after completion of 600 cycles of the TC test, but was 5 or more after completion of 800 cycles of the TC test and was 10 after completion of 1000 cycles of the TC test.

D: The number of the semiconductor devices in which disconnection occurred was 5 or more after completion of 600 cycles of the TC test, but reached 10 before completion of cycles of the TC test.

The measurement results are shown in Table 2, and evaluation items and evaluation results are shown in Table 3.

TABLE 2

|  | t1 [μm] | t2 [μm] | t3 [μm] | t3 − Designed Value | Thickness of Substrate [μm] |
|---|---|---|---|---|---|
| Example 1 | 12 | 4 | 24 | 0 | 146 |
| Example 2 | 12 | 5 | 25 | +1 | 148 |
| Example 3 | 12 | 4 | 24 | 0 | 146 |
| Example 4 | 12 | 4 | 28 | −1 | 154 |
| Example 5 | 12 | 5 | 34 | 0 | 166 |
| Example 6 | 12 | 5 | 55 | +1 | 208 |
| Example 7 | 12 | 7 | 27 | +3 | 152 |
| Example 8 | 12 | 4 | 22 | −2 | 142 |
| Example 9 | 18 | 2 | 20 | 0 | 150 |
| Example 10 | 18 | 7 | 27 | +1 | 164 |
| Example 11 | 18 | 3 | 31 | 0 | 172 |
| Example 12 | 18 | 7 | 26 | 0 | 162 |
| Example 13 | 18 | 12 | 30 | −1 | 170 |
| Comparative Example 1 | 18 | 1 | 64 | −2 | 238 |
| Comparative Example 2 | 18 | 0 | 31 | — | 172 (Defective Molding) |

TABLE 3

|  | Embeddability | Plating Adhesiveness | Insulation Reliability | Connection Reliability |
|---|---|---|---|---|
| Example 1 | A | A | A | A |
| Example 2 | A | A | A | A |
| Example 3 | A | A | A | A |
| Example 4 | A | A | A | A |
| Example 5 | A | A | A | A |
| Example 6 | A | A | A | A |
| Example 7 | D | A | A | B |
| Example 8 | B | B-C | A | A |
| Example 9 | B | A | A | A |
| Example 10 | A | A | A | A |
| Example 11 | B | A | A | A |
| Example 12 | A | A | A | A |
| Example 13 | A | A | A | A |
| Comparative Example 1 | C | A | D | D |
| Comparative Example 2 | D | A | D | D |

As can be seen from Table 3, especially, the prepregs of the Examples 1 to 6 and 9 to 13 had excellent embeddability and plating adhesiveness. In a conventional prepreg, such results were difficult to achieve simultaneously.

Further, since the multilayer substrates using the prepregs obtained in the Examples 1 to 6 and 9 to 13 each having a second resin layer formed of a resin composition having excellent embeddability and low thermal expansivity, they exhibited excellent insulation reliability.

In addition, the semiconductor devices using these multilayer substrates exhibited excellent connection reliability.

Further, as can be seen from Table 2, the multilayer substrate using the prepreg obtained in the Example 6 had a thickness slightly larger than 200 μm, but other multilayer substrates using the prepregs obtained in the Examples 1 to 5 and 7 to 13 had small thicknesses of 200 μm or less.

Therefore, these results show that a multilayer substrate having a small thickness could be obtained according to the present invention. Further, in all of the multilayer substrates using the prepregs obtained in the Examples 1 to 13, squeezing out of the resin composition was not observed.

Further, it was confirmed that all of the semiconductor devices using the prepregs obtained in the Examples 1 to 13 could operate normally without any practical problems.

On the other hand, all of the multilayer substrates using the prepregs obtained in the Comparative Examples 1 and 2 had poor insulation reliability, and therefore the semiconductor devices using these multilayer substrates had poor connection reliability and could not operate normally.

INDUSTRIAL APPLICABILITY

According to the present invention, it is possible to provide a prepreg which can meet a demand for thickness reduction, and which has first and second resin layers having different applications, functions, capabilities, or properties, or which allows an amount of a resin composition in each of the first and second resin layers to be set appropriately depending on a circuit wiring portion to be embedded into the second resin layer.

For example, by appropriately selecting a combination of a first resin composition for the first resin layer and a second resin composition for the second resin layer, it is possible to provide a prepreg whose one surface (first resin layer) has excellent plating adhesiveness and whose other surface (second resin layer) has excellent embeddability.

Further, in the prepreg according to the present invention, a sheet-shaped base member can be located close to one surface of the prepreg in a thickness direction thereof depending on a residual copper ratio of a circuit wiring portion to be embedded thereinto, a circuit thickness (circuit height) thereof, and the like.

This makes it possible to obtain a prepreg which includes a resin layer having a necessary and sufficient amount of a resin composition for filling gaps in a circuit wiring portion to be embedded into the resin layer.

Further, according to the present invention, it is also possible to provide a method for manufacturing the prepreg of the present invention. By using the method according to the present invention, it is possible to easily manufacture the prepreg of the present invention at a low cost.

Furthermore, according to the present invention, it is also possible to provide a substrate using the prepreg of the present invention and a semiconductor device using such a substrate. The substrate and the semiconductor device according to the present invention can have a small thickness.

As a result, the substrate (especially, multilayer circuit substrate) using the prepreg of the present invention can have excellent insulation reliability, and the semiconductor device using such a substrate can have excellent connection reliability.

For these reasons, the prepreg according to the present invention is suitable for manufacturing a multilayer circuit substrate and a semiconductor device which are required to have a higher density and a smaller thickness.

Thus, the present invention has industrial applicability.

What is claimed is:

1. A prepreg, comprising:
 a core layer including a sheet-shaped base member, the core layer having one surface and the other surface which is opposite to the one surface;
 a first resin layer provided on the one surface of the core layer, the first resin layer formed of a first resin composition; and
 a second resin layer provided on the other surface of the core layer, the second resin layer formed of a second resin compound,
 wherein each of the first resin composition and the second resin composition contains a thermosetting resin, an inorganic filler and a coupling agent, and
 wherein at least one of the requirement that a thickness of the first resin layer is different from that of the second resin layer and a requirement that a constitution of the first resin composition is different from that of the second resin composition is satisfied.

2. The prepreg as claimed in claim 1,
 wherein the constitution of the first resin composition is different from that of the second resin composition, and
 wherein the prepreg is adapted to be used in a state that a conductor layer is provided on the first resin layer.

3. The prepreg as claimed in claim 1,
 wherein the constitution of the first resin composition is identical with that of the second resin composition, and the thickness of the first resin layer is different from that of the second resin layer, and
 wherein a thickness of the sheet-shaped base member is 25 μm or less.

4. The prepreg as claimed in claim 2, wherein the conductor layer is bonded to the first resin layer, peel strength between the first resin layer and the conductor layer is 0.5 kN/m or more.

5. The prepreg as claimed in claim 2, wherein the thickness of the first resin layer is in the range of 3 to 15 μm.

6. The prepreg as claimed in claim 1, wherein the thermosetting resin contains cyanate resin.

7. The prepreg as claimed in claim 6, wherein the cyanate resin contains novolak type cyanate resin.

8. The prepreg as claimed in claim 2, wherein the first resin composition further contains a curing agent.

9. The prepreg as claimed in claim 8, wherein the curing agent contains an imidazole based compound.

10. The prepreg as claimed in claim 1, wherein the first resin composition further contains second resin whose kind is different from that of the thermosetting resin.

11. The prepreg as claimed in claim 10, wherein the second resin contains phenoxy based resin.

12. The prepreg as claimed in claim 2, wherein the thickness of the first resin layer is thinner than that of the second layer.

13. The prepreg as claimed in claim 3, wherein a thickness of the prepreg is 35 μm or less.

14. A method for manufacturing the prepreg defined by claim 1, comprising;
 preparing the core layer, a first sheet member having one surface on which the first resin composition is applied in the form of a layer, and a second sheet member having one surface on which the second resin composition is applied in the from of a layer;
 laminating the core layer with the first sheet member and second sheet member so that the first resin composition and second resin composition make contact with both surfaces of the core layer, respectively, whereby the core layer, the first sheet and the second sheet member are joined together to obtain a laminate; and
 removing bubbles from the laminate.

15. The method as claimed in claim 14, wherein joining of the core layer, the first sheet member and the second sheet member is carried out under reduced pressure.

16. The method as claimed in claim 14, wherein removing of the bubbles from the laminate is carried out by a heat treatment.

17. The method as claimed in claim 16, wherein the heat treatment is carried out at a temperature of a melting point or higher, wherein the melting point is a higher melting point that a melting point of the first resin composition and a melting point of the second resin composition.

18. The method as claimed in claim 14, wherein the first sheet member is formed of a conductive material.

19. The method as claimed in claim 14, wherein each of the first sheet member and the second sheet member is formed from a resin sheet, and
 wherein the method further comprises after removing the bubbles from the laminate, removing the resin sheets from the laminate.

20. The method as claimed in claim 19, wherein surfaces of each of the resin sheets on which each resin composition is applied is subjected to a release treatment.

21. A substrate, comprising;
 the prepreg defined by claim 1; and
 a circuit wiring portion embedded into the second resin layer of the prepreg.

22. The substrate as claimed in claim 21, wherein when a total thickness of the prepreg is defined by T0 μm and a height of the circuit wiring portion is defined by t1 μm, a difference of T0 and t1 is 35 μm or less.

23. The substrate as claimed in claim 21, wherein a thermal expansion coefficient of the prepreg in a plane direction thereof is 16 ppm or less.

24. A substrate manufactured by laminating a plurality of the prepregs each defined by claim 1.

25. A semiconductor device, comprising;
 the substrate defined by claim 21; and
 a semiconductor element mounted on the substrate.

26. A semiconductor device having the substrate defined by claim 24.

27. The prepreg as claimed in claim 1, wherein
 when a circuit wiring portion having wires is formed on the second resin layer, a part of the second resin composition is embedded into gaps between the wires of the circuit wiring portion, and a thickness of the second resin layer, in which the part of the second resin composition is embedded into the gaps, is represented by the following formula (1): $B1=t1\times(1-S/100)+t2$, where $B1$ represents the thickness (μm) of the second resin layer, $t1$ represents a thickness (μm) of the circuit wiring portion, $S$ represents a residual copper ratio (%) of the circuit wiring portion, and $t2$ represents a thickness (μm) from an upper surface of the circuit wiring portion to an upper surface of the second resin layer.

* * * * *